United States Patent [19]
Goldberg et al.

[11] Patent Number: 5,511,428
[45] Date of Patent: Apr. 30, 1996

[54] BACKSIDE CONTACT OF SENSOR MICROSTRUCTURES

[75] Inventors: Howard D. Goldberg, Somerville; Martin A. Schmidt, Reading, both of Mass.

[73] Assignee: Massachusetts Institute of Technology, Cambridge, Mass.

[21] Appl. No.: 257,716

[22] Filed: Jun. 10, 1994

[51] Int. Cl.$^6$ ............................................. H01L 29/96
[52] U.S. Cl. ..................................... 73/777; 73/754
[58] Field of Search .................... 73/754, 774, 777, 73/862.629, 862.632; 338/2, 5, 6, 47

[56] References Cited

U.S. PATENT DOCUMENTS

| | | | |
|---|---|---|---|
| 4,780,572 | 10/1988 | Kondo et al. | 73/754 |
| 4,851,371 | 7/1989 | Fisher et al. | 437/209 |
| 4,896,098 | 1/1990 | Haritonidis et al. | 324/663 |
| 4,908,693 | 3/1990 | Nishiguchi | 73/777 |
| 5,062,302 | 11/1991 | Petersen et al. | 73/754 |
| 5,138,414 | 8/1992 | Shinohara | 73/777 |
| 5,172,205 | 12/1992 | French et al. | 73/777 |
| 5,199,298 | 4/1993 | Ng et al. | 73/54.01 |
| 5,343,064 | 8/1994 | Spangler et al. | 257/418 |
| 5,386,142 | 1/1995 | Kurtz et al. | 257/508 |

OTHER PUBLICATIONS

Patton et al., "Hydrophilic Membranes as Media for solid State Oxygen Sensors," Transducers '85, IEEE Int. Conf. on Solid–State Sensors and Actuators, p. 423, Phil., PA., Jun. 1985.

Sakai et al., "Ion sensitive FET with a silicon –insulator –silicon structure," Transducers '87, Int. Conf. on Solid-State Sensors and Actuators, pp. 711–713, Tokyo, Japan, Jun. 1987.

van den Vlekkert et al., "A pH–ISFET and an integrated pH–pressure sensor with back–side contacts," Sensors and Actuators, V. 14, pp. 165–176, 1988.

Hu et al., "Carbon dioxide gas–sensing electrode based on a pH–ISFET with back–side contacts," Sensors and Actuators, V. 17, pp. 275–278, 1989.

Kloeck et al., "A combined pH–pressure catheter for gastroenterological applications," Sensors and Actuators, V. 17, pp. 541–545, 1989.

(List continued on next page.)

*Primary Examiner*—Richard Chilcot
*Assistant Examiner*—Eric S. McCall
*Attorney, Agent, or Firm*—Theresa A. Lober

[57] ABSTRACT

A sensor microstructure contact scheme is provided for making backside electrical, mechanical, fluidic, or other contact to mechanical microstructures. The contact scheme is applicable to pressure sensors, shear stress sensors, flow rate sensors, temperature sensors, resonant microactuators, and other microsensors and microactuators. The contact scheme provides a microelectromechanical sensor body and support structure for backside contact of the sensor body, and features a support wafer substrate having one or more through-wafer vias each with a lateral span on the dimension of microns and a span that is more narrow at the wafer front surface than at the wafer back surface. An insulating film covers a portion of the support wafer substrate and sidewalls of the vias—with the lateral via span at the front surface being open. The front surface of the support wafer substrate is bonded to the front surface of a sensor body wafer substrate, such that contact of the front surface of the sensor body wafer substrate may be made through the support wafer substrate vias from the back surface of the support wafer substrate. The sensor body wafer substrate is adapted to define a mechanical sensor microstructure, and comprises a plurality of isolated substrate regions, each region corresponding to one of the support wafer substrate through-wafer vias. Each such region is circumscribed by an edge of the mechanical sensor microstructure and an isolating border region. Contact made through one of the support wafer substrate through-wafer vias to the corresponding one of the sensor body substrate regions is isolated and thereby prevented from making contact to any other sensor body substrate region.

43 Claims, 10 Drawing Sheets

OTHER PUBLICATIONS

Ewald et al., "Technology For Backside Contacted pH-sensitive ISFETs Embedded in a p–Well Structure," Sensors and Actuators, B1, pp. 335–340, 1990.

Sakai et al., "A Backside Contact ISFET with a Silicon–Insulator–Silicon Structure," Sensors and Actuators, B1, pp. 341–344, 1990.

Verlinden et al., "High Efficiency Backside contact Solar Cells with a Self–Aligned Process and New Text. Tech. for Si.," $10^{th}$ Photovoltaic Solar Eng. Conf., pp. 246–249, Portugal, Apr. 1991.

Linder et al., "WaferStack–Technology," Abst., Eth Zurich, Inst. of Quantum Elect., Phys. Elect. Lab, Annual Report, 1992.

van den Vlekkert et al., "Multi– ion sensing device for horticultural appl. based upon chem. mod. and special packaging of ISFETs, " Sensors and Actuators B, N. 6, pp. 34–37, 1992.

Johansson et al., "A Three–dimensional Architecture for a Parallel Processing Photosensing Array," IEEE Trans. Biomed. Eng., V. 39, N. 12, pp. 1292–1297, Dec. 1992.

Nishiwaki et al., "Through–Hole contact (THC) integrated––type a– Si solar cell submodule by a laser photo–etching method," Solar Energy. Mat. and Solar Cells, V. 31, pp. 97–108, 1993.

Merlos et al., "Low Cost Fabrication Tech. for IC–compatible Backside Contacted ISFET's," Sensors and Their Applications VI, Manchester, UK, Sept. 1993.

Linder et al., "Fab. Tech. for Wafer Through–Hole Interconnections and Three–Dim. Stacks of Chips and Wafers," IEEE MEMs, pp. 349–354, Oiso, Japan, Jan. 1994.

5,511,428

BACKSIDE CONTACT OF SENSOR MICROSTRUCTURES

BACKGROUND OF THE INVENTION

This invention relates to techniques for contacting sensor microstructures.

There has now been developed a wide range of microelectromechanical systems, including microsensors and microactuators, for sensing, measurement, and movement in the micron regime, i.e., in the dimensional range of microns. Such microelectromechanical systems have been shown effective and efficient at sensing and measuring stress, temperature, pressure, and flow rate, for example, among other characteristics, as well as performing micromovement actuation in response to sensed or imposed stimulation. The success of microelectromechanical systems has in part been due to the ability to produce them using conventional microfabrication techniques with conventional electronic materials, exploiting the mechanical properties of these electronic materials. Silicon in particular has been shown to have excellent mechanical properties and lends itself well to microstructure fabrication.

In a typical microsensor application, the sensor is preferably located in intimate, unobstructed contact with the environment to be sensed, and yet should not, by the nature of its presence in that environment, alter or inhibit characteristics of the environment. This places difficult constraints and requirements on sensor packaging the contact design. For example, in a flow sensor, it is imperative that any electrical, mechanical, or other contact to the sensor not form a protrusion, even on the micron scale, into the stream of flow to be measured which could perturb the flow characteristics of the system in the vicinity of the sensor; such perturbation would obviously impact the clarity and trueness of flow measurements.

Furthermore, many industrial manufacturing processes, e.g., melt extrusion, have historically evolved to permit on-line measurement of manufacturing characteristics only in a manner that inherently does not disturb the manufacturing process while monitoring it. Thus the successful application of microelectromechanical sensors to manufacturing processes as substitutes for conventional macro-sized sensors that have historically provided such monitoring requires that the microsensors have the same non-intrusive characteristics as the macro-sized sensors; and indeed, it has been shown that a given microsensor is inherently capable of being less intrusive and at the same time more effective than its macro-sized counterpart.

To complicate matters further, operation of typical microelectromechanical sensors is based on some type of moveable microstructure whose motion is correlated to an attribute of interest to be sensed and measured. Exposure of the microstructure to the process to be monitored should not perturb the process environment as the microstructure moves in the environment, and furthermore, packaging of and contact to the microstructure should not perturb the process environment. In monitoring an extrusion process, for example, a melt monitoring sensor such as a shear stress sensor, positioned in a wall of the melt extrusion barrel, should not perturb the flow of melt through the extruder barrel and yet must intimately contact the flowing melt. As a result, complicated and elaborate electrical power and read out connections for flow sensors have typically been used to avoid perturbing the flowing melt to be sensed.

In one such microelectromechanical shear stress sensor, designed for measuring shear stress of a flowing fluid such as an extruded melt, disclosed in U.S. Pat. No. 5,199,298, by Ng et al., issued Apr. 6, 1993, an electrical contact strip layer is located on the top face of a movable, floating element which measures shear stress of the melt, fully exposed to the melt fluid being monitored. The contact strip layer thus protrudes into the melt stream, affecting the stream flow, and depending on its material, possibly introducing unwanted constituents into the melt or itself being impacted by the melt constituents. In an alternative embodiment of U.S. Pat. No. 5,199,298, it is suggested that some type of contact to the floating element could be formed through the wafer on which the floating element is fabricated, near to the end of the floating element fabrication sequence, after the floating element has been fabricated. This contact scheme is intimately tied to the particular preferred floating element geometry of U.S. Pat. No. 5,199,298, and so is not readily applicable to other sensor designs. For example, the common situation in which isolated electrical contact must be made to adjacent sensor or wafer regions is not addressed by the geometry of U.S. Pat. No. 5,199,298; no lateral isolation of contact points is provided for with that structure.

Other proposed sensor microstructure contact schemes have also been tied to a particular sensing structure, and due to this, as well as fabrication complexity, are likewise not generally applicable to microstructure designs. Perhaps most importantly, such schemes typically provide for only one mode of contact, for example, fluid contact, without providing for other modes of contact, such as mechanical. Thus, to this time, an adaptable, generally applicable, non-intrusive sensor microstructure contact scheme is yet to be attained.

SUMMARY OF THE INVENTION

The present invention provides a microstructure contact scheme which allows for backside contact of mechanical sensor microstructures, which may be moveable microstructures. This contact may be electrical, mechanical, as in pressure contact, fluidic, or otherwise in nature. The contact scheme of the invention provides a microelectromechanical sensor body and support structure for backside contact of the sensor body, featuring a support wafer substrate having one or more through-wafer vias each with a lateral span on the dimension of microns and a span that is more narrow at the wafer front surface than at the wafer back surface. An insulating film covers a portion of the support wafer substrate and sidewalls of the vias—with the lateral via span at the front surface being open. The front surface of the support wafer substrate is bonded to the front surface of a sensor body wafer substrate, such that contact of the front surface of the sensor body wafer substrate may be made through the support wafer substrate vias from the back surface of the support wafer substrate. The sensor body wafer substrate is adapted to define a mechanical sensor microstructure, and comprises a plurality of isolated substrate regions, each region corresponding to one of the support wafer substrate through-wafer vias. Each such region is circumscribed by an edge of the mechanical sensor microstructure and an isolating border region. Contact made through one of the support wafer substrate through-wafer vias to the corresponding one of the sensor body substrate regions is isolated and thereby prevented from making contact to any other sensor body substrate region.

In various other embodiments, the isolating border regions circumscribing isolated sensor body wafer substrate regions each comprise a trench in the sensor body wafer substrate. This trench exposes the support wafer substrate, such that contact made through one of the through-wafer vias is isolated by the trenches and prevented from making contact to more than one sensor body substrate region. In other embodiments, each sensor body substrate region comprises a conducting region that is electrically isolated from the other conducting regions by the trench circumscribing the region.

The invention features forming the through-wafer vias by a fabrication process in which the vias are first formed and then the sensor body wafer substrate is bonded to the support wafer substrate, and further features forming the mechanical sensor microstructure after the sensor body wafer substrate is bonded to the support wafer substrate.

In one embodiment, the support wafer substrate and the sensor body wafer substrate each are silicon substrates, the insulating film on the support wafer substrate is an oxide, and a conducting film, particularly a polycrystalline conducting film, and most particularly a high-temperature conducting film covers this oxide film on the via sidewalls. The oxide film covering the support wafer substrate includes an opening on the front surface of the support wafer substrate. This opening exposes the front surface of the support wafer substrate and results in a trench, defined by the opening, over which the mechanical sensor body microstructure is suspended. In one embodiment, this trench is grooved to extend the trench to a depth below the front surface of the support wafer substrate.

In other embodiments of the invention, the front surface of the sensor body wafer substrate is doped to provide an etch stop layer, such that etching of the back surface of the sensor body wafer substrate terminates at the doped etch stop layer. The oxide film covering the support wafer substrate includes an opening in the oxide film on the back surface of the support wafer substrate, such that electrical contact may be made to the support wafer substrate. In an alternative embodiment, the front surface of the sensor body wafer substrate comprises an insulating dielectric etch stop layer, such that etching of the back surface terminates at the dielectric layer.

In another embodiment of the invention, the mechanical sensor microstructure comprises a plate, having a thickness on the dimension of microns, suspended over the trench in the oxide film on the support wafer substrate front surface. In one embodiment, this plate comprises a floating element which is free to move laterally in response to an applied force in a direction parallel to the front surface of the sensor body wafer substrate. First peripheral portions of the floating element are released from surrounding areas of the sensor body wafer substrate, while second peripheral portions are each tethered by an arm to a corresponding one of the isolated sensor body substrate regions, such that electrical contact made through of the vias to the corresponding substrate region and tether arm is isolated and prevented from making contact to any other tether arm. The floating element may comprise a shear stress sensor, in which at least two of the tether arms are electrically doped to define piezoresistive elements on the arms. Each such element exhibits a characteristic resistance that changes in response to lateral movements of the floating element when a voltage is applied across the tether arms by electrical contact from the back surface of the support wafer substrate through the support wafer vias to the corresponding isolated sensor body substrate regions and arms. In another embodiment, the floating element comprises a shear stress sensor defining a capacitor between the element and each of one or more good conducting regions in the oxide trench on the front surface of the support wafer substrate. The conducting regions are each positioned such that isolated electrical contact may be made to each conducting region. Each capacitor changes its capacitance in response to lateral movements of the floating element when a voltage is applied across the tether arms of the floating element by electrical contact from the back surface of the support wafer substrate, through the vias, to the corresponding isolated substrate regions and tether arms, and the conducting regions. In particular, these good conducting regions are each conducting pads, which preferably are coated with a dielectric layer, and are each positioned with respect to a via such that isolated electrical contact is to the pad through the corresponding via.

In another embodiment, the micromechanical plate comprises a thermal flow rate sensor microbridge. First peripheral portions of the microbridge are released from surrounding areas of the sensor body wafer substrate, and second peripheral portions are clamped to a corresponding one of the isolated sensor body substrate regions, such that electrical contact made through one of the vias to the corresponding substrate region and microbridge clamp is isolated and prevented from making contact to any other microbridge clamp. An area of the microbridge is electrically doped to define a resistive element which exhibits a characteristic resistance; this resistance changes in response to changes in temperature of the resistive element resulting from flow of a fluid stream across the microbridge while a current source is connected across the resistive element by electrical contact from the back surface of the support wafer substrate through the vias to corresponding isolated sensor body regions and microbridge clamps. In another embodiment of the invention, the thermal microbridge comprises a temperature transducer, whereby resistance of the resistive element changes in response to a change in ambient temperature, and whereby the temperature of the thermal microbridge changes in response to a change in resistance of the resistive element.

In a further embodiment, the micromechanical plate comprises a pressure sensor diaphragm which is free to move in a vertical direction perpendicular to the front surface of the sensor body wafer substrate. Portions of peripheral edges of the diaphragm are electrically doped to define piezoresistive elements, each element positioned with respect to a through-wafer via such that isolated electrical contact to the element may be made through the corresponding via. Each piezoresistor exhibits a characteristic resistance that changes in response to vertical movement of the diaphragm when a voltage is applied across the piezoresistor when a voltage is applied across the elements by electrical contact from the back surface of the support wafer substrate through the vias to the resistive elements. In another embodiment, a capacitor is defined between the diaphragm and one or more conducting regions in the trench in the oxide film on the front surface of the support wafer. Each conducting region is positioned such that isolated contact may be made to it. Each defined capacitor has a characteristic capacitance that changes in response to vertical movements of the diaphragm when a voltage is applied across the capacitor by electrical contact from the back surface of the support wafer substrate through the support wafer vias to the corresponding isolated substrate regions and the conduction regions. Preferably, the conducting regions comprise conducting pads, which are preferably coated with a dielectric layer, and which are each positioned with respect to a corresponding via such that isolated contact may be made to each pad through the corresponding via.

In a further embodiment of the invention, the micromechanical floating element comprises a resonant element tethered by a plurality of arms. The resonant element laterally resonates in response to application of an AC voltage applied between the floating element and an area of the front surface of the sensor body wafer substrate not suspended over the trench, by electrical contact from the back surface of the support wafer substrate through the support wafer vias to the corresponding isolated sensor body substrate regions. In one embodiment, a capacitor is defined between the resonant element and one or more conducting regions in the trench in the film on the front surface of the support wafer substrate. Each such capacitor has a characteristic capacitance that changes in response to lateral movement of the resonant element when a voltage is applied across the capacitor by electrical contact from the back surface of the support wafer substrate through the vias to the corresponding isolated substrate region and conduction region. Control of the movement of the resonant element may be achieved by application of a control voltage across the capacitors.

The invention features fabrication of a sensor body and support structure for backside contact of the sensor body by first forming an oxide layer on the front and back surfaces of a support wafer substrate, forming a layer of nitride on the oxide layer, and photolithographically patterning and etching the oxide and nitride layers on the back surface of the support wafer substrate to define a location for at least one through-wafer via on the back surface of the support wafer substrate. The support wafer substrate is then anisotropically etched until the vias extend completely through the support wafer substrate to the oxide layer, and the oxide layer is etched so that the lateral span of the vias is open. An oxide layer is formed on sidewalls of the etched vias and the nitride layer is etched to remove it from the oxide layer. Then the front surface of the support wafer substrate is high-temperature wafer bonded to the front surface of a sensor body wafer substrate. In preferred embodiments, the oxide layer is etched to define an opening in the oxide before forming the layer of nitride on the oxide. The opening exposes the front surface of the support wafer and results in a trench over which the sensor body wafer substrate is suspended after it is bonded to the support wafer substrate.

The invention further features continuing the fabrication by etching the sensor body wafer substrate from a back surface to remove a substantial thickness of the substrate and leaving a plate, having a thickness on a dimension of microns, suspended over the trench on the front surface of the support wafer substrate. Preferably, the oxide film on the back surface of the support wafer substrate is photolithographically patterned and etched to define an opening in the oxide layer before forming the layer of nitride on the oxide layer, the opening exposing the back surface of the support wafer substrate for contact to the substrate during process steps and sensor operation, so that the sensor body wafer substrate is electrochemically etched, during which electrical contact is made to the support wafer substrate through the opening in the oxide layer on the back surface of the support wafer substrate and electrical contact is made to the sensor body wafer substrate through a support wafer substrate through-wafer via.

The sensor body wafer substrate is patterned to produce isolating border trenches circumscribing isolated sensor body substrate regions, each region corresponding to one of the support wafer substrate vias. The plate is patterned and etched to produce a floating element having first peripheral portions released from surrounding areas of the sensor body wafer substrate, the floating element being free to move laterally in response to an applied force in a direction parallel to the front surface of the sensor body wafer substrate. Other portions of the floating element are each tethered by an arm to a corresponding one of the isolated sensor body substrate regions, such that electrical contact made through one of the vias to the corresponding one of the substrate regions and tether arms is isolated and prevented from making contact to any other substrate region and tether arm. In one embodiment, at least one conducting pad is formed in the trench on the front surface of the support wafer substrate. Preferably, a high-temperature conducting film is formed on the sidewalls of the though-wafer vias, and the isolated sensor body substrate regions are electrically doped.

A pivotal advantage of the backside contact structure of the invention is its flexible application to a wade array of sensor microstructure designs, to allow for contact to and packaging of such structures in a way that does not at all perturb one face of the sensor, so that the sensor may intimately interact with an exposed environment in an unobstructive manner. Such interaction is particularly important in fluidic as well as gaseous flow environments.

DESCRIPTION OF A PREFERRED EMBODIMENT

The invention is pointed out with particularity in the appended claims. The above and further features and advantages of the invention may be better understood by referring to the following description of a preferred embodiment taken in conjunction with the accompanying drawings, in which:

Figure 1A:
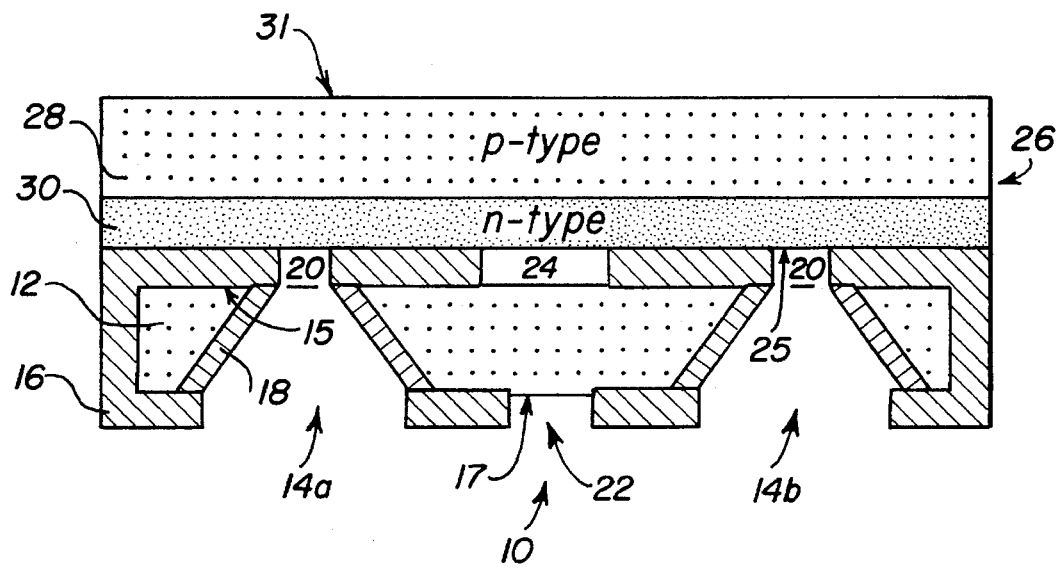
FIG. 1A is a cross sectional diagram of a backside contact structure according to the invention.

Illustrated in FIG. 1A is a cross-sectional view of the microfabricated sensor contact structure, referred to as 10 in the figure, which embodies the invention. The contact structure 10 consists of a support wafer substrate 12, e.g., a silicon wafer or other suitable wafer substrate, in which are located one or more through-wafer vias 14 whose sidewalls extend completely through the support wafer from its front surface 15 to its back surface 17. The lateral extent of the vias 14 is more narrow at the front surface than at the back surface of the wafer substrate; while it is intended for the via dimensions to be on the order of microns, the exact via dimensions will be dependent on the particular fabrication process used, as explained later.

The support wafer surfaces and via sidewalls may be covered with an insulating layer, 16 and 18 respectively, for dielectric isolation of the substrate and vias. If such an isolation layer is used, however, it is removed at the location of the vias 14 at the wafer front surface 15 so that the vias are open at that surface. Additionally, the dielectric isolation layer on the back surface 17 of the support wafer may be removed in a selected area or areas to produce openings 22 exposing the back surface for making electrical contact to that surface during fabrication or operation of a sensor using the support structure.

The dielectric isolation layer on the front surface 15 of the support wafer may likewise be removed in selected areas, here to produce a trench 24 defined by the gap between the support wafer front surface 15 and the front surface 25 of a microsensor structure wafer substrate 26. The trench, as explained in detail in later discussion, acts to suspend the microsensor wafer 26 over the support wafer for the extent of the trench. The microsensor structure wafer substrate, like the support wafer, may consist of a silicon substrate, adapted e.g., for a particular fabrication process; for example, the substrate may comprise a silicon region of one doping, say a p-type layer 28, stacked atop a region of a second doping, say an n-type layer 30. Alternative wafer substrate materials and compositions may also be employed, as will be understood.

With this construction, the contact structure 10 provides the ability to directly contact the front surface 25 of the microsensor structure wafer substrate 26 from the back surface 17 of the support wafer substrate 12 through the vias 14 in the support wafer. This contact may be electrical, mechanical, as in pressure contact, fluidic, or otherwise in nature. The inventors herein have recognized that such a structure may be adapted for a wide array of microsensor designs, including moveable microstructures, to allow for contact to and packaging of such structures in a way that does not at all perturb one face of the sensor, for example the back surface 31 of the sensor support wafer 26; so that the sensor may intimately interact with an exposed environment in a unobstructive manner. Such interaction is particularly important in fluidic as well as gaseous flow environments.

Figure 1B:
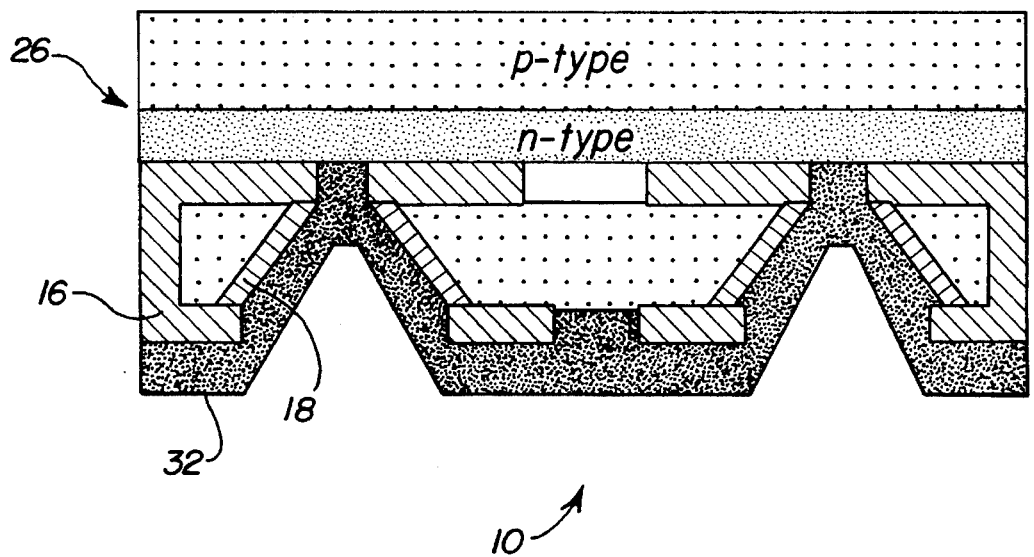
FIG. 1B is a cross sectional diagram of the contact structure of FIG. 1A adapted for making electrical contact.

Referring to FIG. 1B, electrical contact may be made through the contact structure 10 of the invention by, for example, forming a conductive layer 32 over the via sidewall dielectric layer 18 and the dielectric layer 16 covering the back surface 17 of the support wafer substrate. This electrically conductive layer 32 fills the via opening 20 such that good electrical contact to the sensor structure wafer may be secured. Likewise, the conductive layer may fill the opening 22 in the dielectric layer on the back surface of the support wafer so that good electrical contact to the support wafer is secured. As will be understood by those skilled in the art, direct contact to the conducting layer 32 may then be achieved using metal layers and bonding wires, or other technique suitable for a given microsensor application.

The particular utility and advantages of the contact structure of the invention are best brought to light through examples of its application to various microsensor structures. While these examples are presented to bring out various aspects of the invention, they are not meant to limit the scope of applicability, and indeed, will lead those skilled in the art to understand the even wider array of possible applications.

Turning then to FIG. 2, there is shown a piezoelectric shear stress sensor 34 employing the contact scheme of the invention. Briefly, measurement of the shear stress at a wall bounding a fluid flow can be used to determine flow and compositional characteristics of the fluid flowing past the wall. The shear stress sensor 34 accomplishes this using a floating element microstructure 36 which moves laterally in response to a fluid flow directed parallel to its top surface. In operation, the sensor is mounted in a wall containing a flowing fluid, such as a melt, to expose it to the fluid flowing alongside the wall in which the sensor is mounted.

Figure 2A:
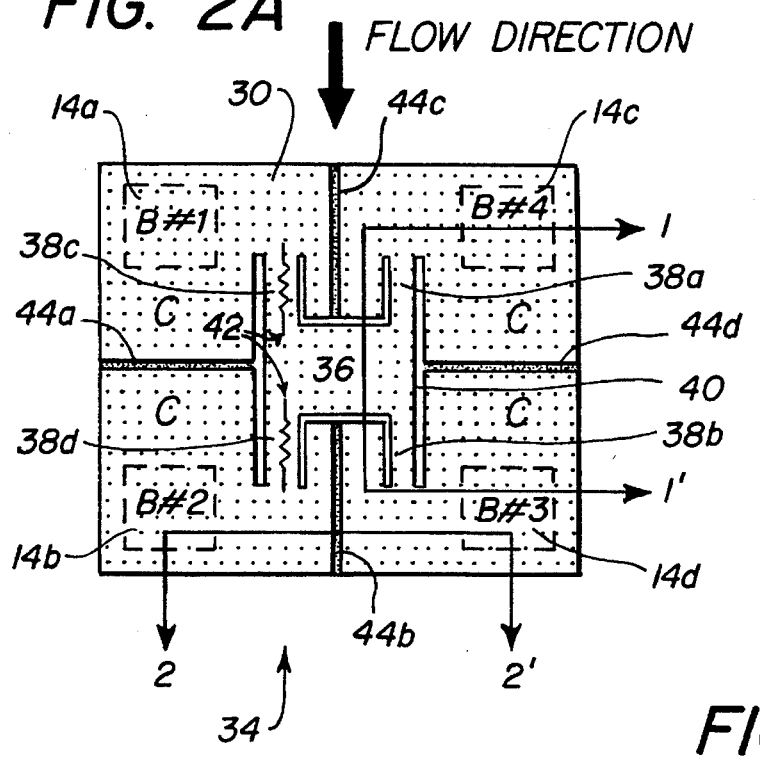
FIG. 2A is a top-down diagram of a half-bridge piezoelectric shear stress sensor employing backside contact according to the invention.
Figure 2B:
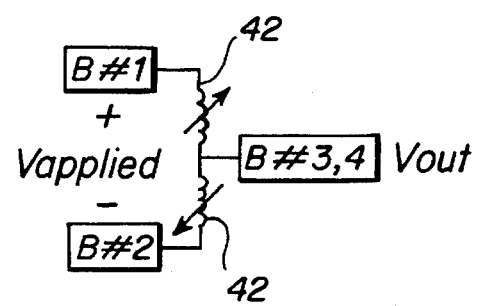
FIG. 2B is a circuit schematic corresponding to the sensor of FIG. 2A.
Figure 2C:
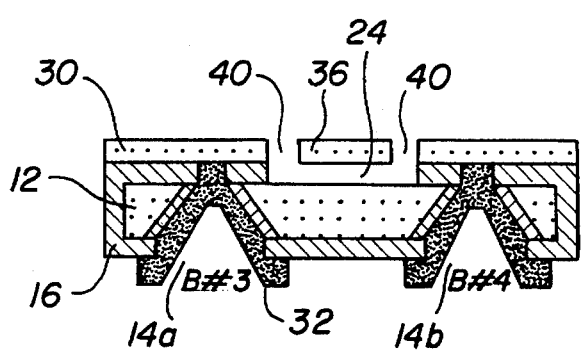
FIG. 2C is a first diagrammatic view of the sensor FIG. 2A taken through cross section 1–1'.
Figure 2D:
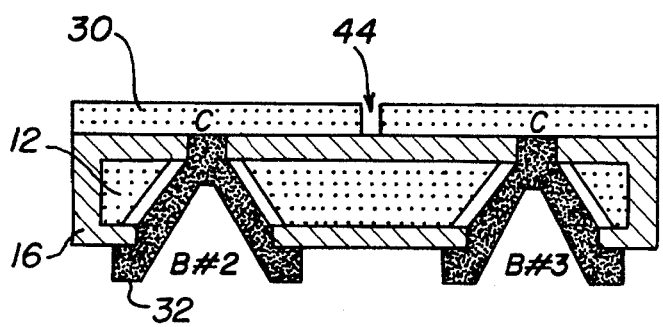
FIG. 2D is a second diagrammatic view of the sensor of FIG. 2A taken through cross section 2–2'.

In more detail, considering FIGS. 2A–2C, the floating element microstructure 36 is formed from some portion, for example a doped layer 30 (as shown in FIG. 1), of the sensor structure wafer. The floating element 36 is suspended over the trench 24 between the support wafer substrate and sensor structure wafer and is tethered by four arms 38 to regions of the sensor structure wafer 30 that are not suspended over the trench. A lateral gap 40 defines the edges of the floating element, with the edge of each tether arm remaining connected to the sensor structure wafer, and provides for lateral movement of the element in response to fluid shear stress. FIG. 2C, showing a cross section taken through 1–1' of FIG. 2A, illustrates the suspension of the floating element 36 and the lateral gap 40 surrounding it.

In a half-bridge piezoresistive sensor scheme, two of the four tether arms 38 are doped to define piezoresistive elements 42. When a voltage is applied across the resistive elements 42 and the floating element 36 moves laterally in response to fluid shear stress, the resistance of the floating elements changes correspondingly. This resistive change provides means for transduction of fluid shear stress to a measurable electrical signal.

Electrical contact to the floating element tether arms is achieved using backside contact through the vias 14 (identified as B #1–B#4) in the support wafer substrate 12. Each via provides the ability to make isolated electrical contact to one region of the sensor support wafer 30 corresponding to one of the tether arms 38. These isolated regions are defined by trenches 44, shown in FIG. 2D—a cross section taken through 2–2' of FIG. 2A—in the sensor structure wafer which act to physically separate and thus electrically isolate the regions. For example, electrical contact made through via B#1 makes electrical connection to an area defined by two substrate trenches (44a and 44c), the lateral gap 40 surrounding the floating element 36, and the edge of one tether arm 38c. Similarly, the other vias B#2–B#4 make contact to a well-defined isolated region. In this way, a voltage applied between vias B#1 and B#2 produces that voltage across the two corresponding piezoresistive tether arms 38c and 38d, in series, and isolates the voltage from the other two tether arms 38a and 38b.

As shown in FIG. 2B, this scheme defines a piezoresistive half-bridge such that a voltage applied between contacts B#1 and B#2 sets up a voltage divider relationship between the two tether piezoresistors 42; these voltages may be measured between either of contacts B#3 or B#4 and ground potential. Then, as explained earlier, a shear stress across the floating element may be transduced to an electrical signal based on changes in the resistive elements as the floating element moves in response to the shear stress.

It must be emphasized that without the trench isolation scheme, it would not be possible, as a practical matter, to make isolated electrical contact to the floating element without the use of some top side electrical layer, as was typically used in the prior art. As will be recognized by those skilled in the art, alternative isolation boundary techniques may also be employed, using for example, selective doping or other techniques.

Figure 3A:
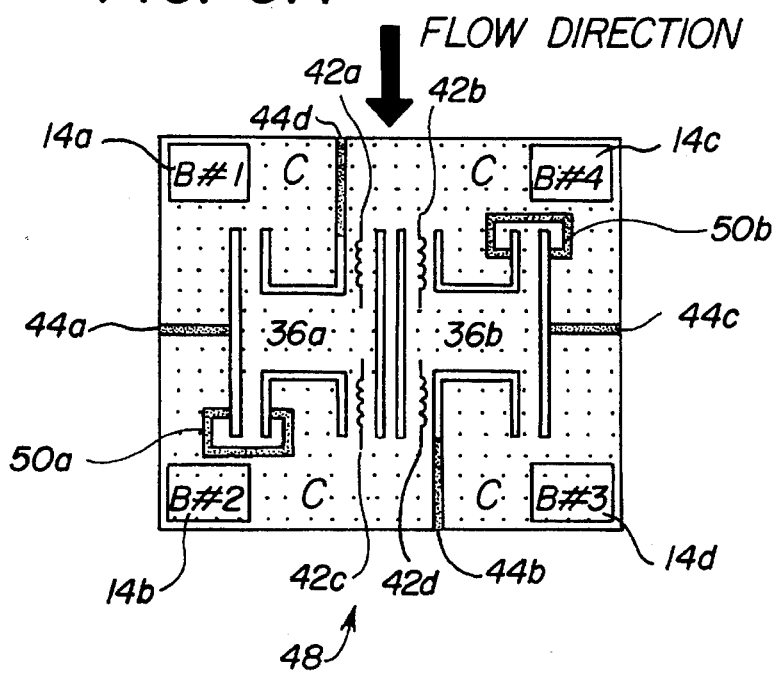
FIG. 3A is a top-down diagram of full-bridge piezoelectric shear stress sensor employing backside contact according to the invention.
Figure 3B:
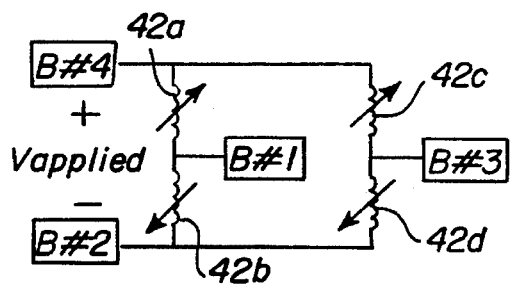
FIG. 3B is a circuit schematic corresponding to the sensor of FIG. 3A.

A full-bridge piezoresistive shear stress sensor, as shown in FIG. 3A, utilizes two identical floating elements 36a and 36b, each suspended over a trench between the support wafer and sensor structure wafer and each having four tether arms connected to surrounding substrate regions in a manner that defines a full bridge electrical circuit, as shown in FIG. 3B. Specifically, each of two arms of each floating element is doped to define a piezoresistive element 42a–42d, which changes resistance in response to lateral movements of the floating elements due to shear force. Isolation trenches 44a–44d, along with tether arm trenches 50a and 50b electrically isolate regions of the sensor structure wafer, as in the manner described in conjunction with the half-bridge sensor.

With this configuration, a voltage applied between vias B#2 and B#4 produces that voltage across the series combination of piezoresistors 42a and 42b, in parallel with the series combination of piezoresistors 42c and 42d. Output voltage to define the full bridge relationship is measured between vias B#1 and B#3. Note that this full bridge, duel floating-element structure takes advantage of the trench isolation scheme to simply and elegantly define a rather complicated circuit using only the geometry of the sensor structure wafer.

Figure 4A:
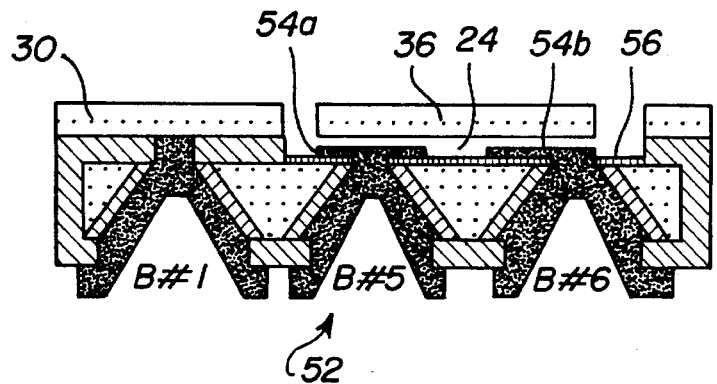
FIG. 4A is a cross sectional diagram of a capacitive shear stress sensor employing backside contact according to the invention.

A variation of a shear stress sensor transduction technique, using capacitive transduction, as shown in cross section in FIG. 4A, may also advantageously employ the contact structure of the invention. Such a shear stress sensor uses a planar floating element geometry identical to that of the half-bridge piezoresistive sensor of FIG. 2A. In the capacitive sensor, however, no piezoresistors are defined in the tether arms 38 of the floating element. Instead, in the trench 24 over which the floating element is suspended, two or more conducting pads 54a, 54b are positioned, each aligned with an edge of the floating element in its resting position, and aligned with an isolated contact via, B#5 and B#6, respectively. A dielectric layer 56 may be formed under the conducting pads to ensure dielectric isolation between the pads.

Figure 4B:
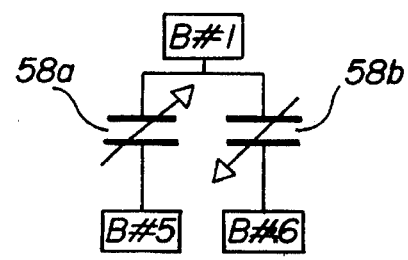
FIG. 4B is a circuit schematic corresponding to the sensor of FIG. 4A.

In one possible mode of operation, backside via contacts B#1–B#4 are all held at the same electrical potential, thereby setting the entire surface of the floating element at that potential, or alternatively, only one via contact, say B#1, is used and no isolation trenches 44 are required. Then as shown in FIG. 4B, two capacitors are defined—a capacitive element 58a between the floating element (electrified from B#1) and one conducting pad 54a, in parallel with a second capacitive element 58b between the floating element and another conducting pad 54b.

As the floating element moves laterally in response to a fluid shear stress, each of the capacitive elements 58a, 58b changes its capacitance accordingly, and measurement of this change, with an appropriate charge amplification circuit, for example, provides for transduction of a shear stress through the capacitance. Positioning of each conducting pad under the floating element in relation to a backside via, thereby achieving direct and isolated contact to each pad, is a pivotal advantage provided for by the backside contact scheme of the invention; no additional front-side contact layers are required to create a capacitor voltage between the floating element and conducting pads below it.

Variations of this capacitive sensor design could include, e.g., the use of a diffused, doped conducting region, rather than a deposited conducting pad, located under the floating element. Backside electrical contact could then be made to such a region using, e.g., an opening in the insulating film on the backside of the support wafer substrate, as shown in FIGS. 1A and 1B; this type of contact is advantageously inherently isolated from contact to the floating element because it is physically isolated from the through-wafer vias. Other conducting pad variations may also be employed.

Turning now to another class of microsensors employing the contact scheme of the invention, FIG. 5 illustrates a thermal microbridge that may be adapted for measuring flow rate or temperature. Operation of this class of microsensors is based on the temperature dependency of resistance characteristics. The resistance of a suspended resistive element is related to the temperature of the element and the dominant heat loss mechanism, which may be either convective or conductive. By controlling both the temperature of a resistive microbridge and which type of heat loss mechanism dominates its cooling, ambient temperature and flow rate characteristics may be determined. For example, temperature sensing is accomplished using a resistor scheme in which the microbridge does not significantly Joule heat and instead assumes the ambient temperature of the environment. Then, the resistance of the resistor is related to the ambient temperature of the environment. In contrast, flow rate sensing is accomplished using a resistor scheme in which the microbridge is substantially Joule heated in a regime where the predominant heat loss mechanism is forced convection to a fluid flow stream. In this case, as the resistive element cools, its resistance changes in proportion to the fluid flow rate. If there is a priori knowledge of the fluid flow profile, the resistance change may also be used to determine shear stress forces in the fluid.

Figure 5A:
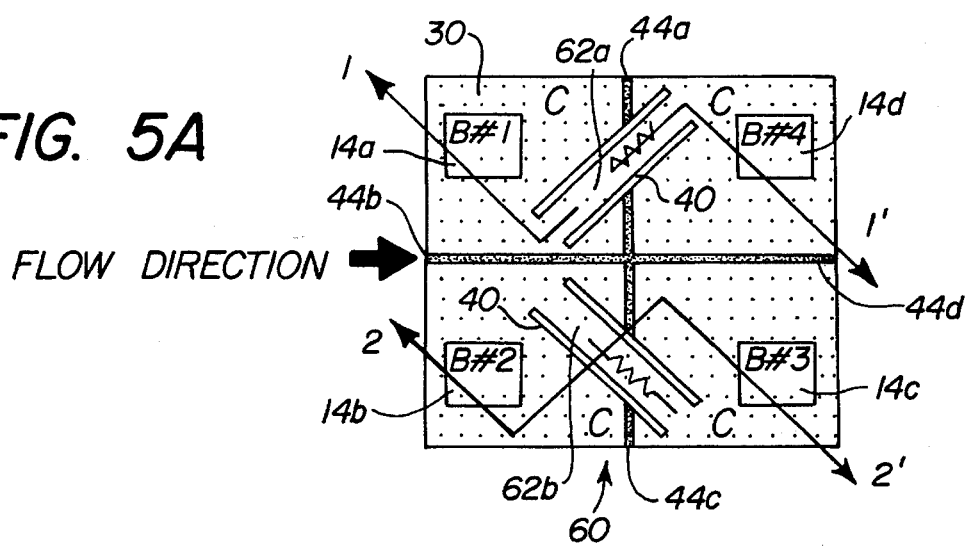
FIG. 5A is a top-down diagram of a thermal flow rate sensor employing backside contact according to the invention.

There is shown in FIG. 5A a thermal microbridge sensor 60 for sensing flow magnitude and direction. The flow sensor consists of a pair of microbridges 62a and 62b which are each a part of the plane of the sensor support wafer layer 30, just as in the case of the piezoresistive shear stress element. Referring also to FIG. 5C, which is a cross section taken through 1–1' of FIG. 5A, each microbridge is suspended over a trench 24 defined between the support wafer surface 15 and the sensor structure wafer layer 30. The length of each side of the two microbridges is bordered by a lateral gap 40 such that fluid may flow under the bridges. The ends of the bridges are clamped to substrate regions that are each isolated and that correspond to one backside contact via, 14a–14d (shown as B#1–B#4). A system of trenches 44a–44d in the sensor structure wafer layer 30 electrically isolates each of these regions so that the application of a current source across contact vias B#1 and B#4 forces the current through one resistive microbridge 62a without any impact on the other resistive microbridge 62b. Similarly, application of a current source across contact vias B#2 and B#3 forces the current through only the other resistive microbridge 62b.

Figure 5B:
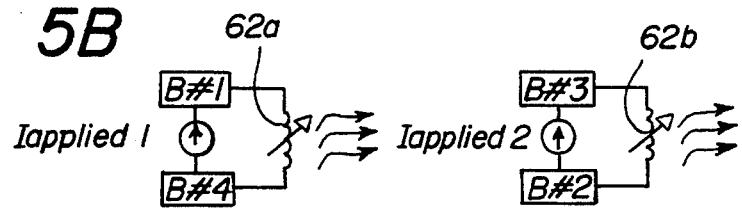
FIG. 5B is a circuit schematic corresponding to the sensor of FIG. 5A.
Figure 5C:
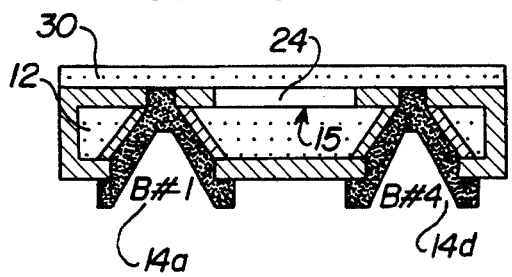
FIG. 5C is a diagrammatic view of the sensor of FIG. 5A taken through cross section 1–1'.

As shown in FIG. 5B, each microbridge acts as a resistive element when a current source is applied across it in the manner given above. To operate as a flow rate sensor, the microbridges are heated in a regime where the predominant heat loss mechanism is forced convection to the fluid flow stream; the flush trench 24 under each microbridge reduces the amount of heat from the microbridges lost to conduction to the support wafer substrate. When exposed to a flowing fluid flow, changes in the resistivity of the microbridges may be correlated to changes in the fluid flow. While only one microbridge would suffice for detecting flow magnitude, a pair of microbridges 62a and 62b, allows for inference of flow direction from the common mode and differential cooling of the two microbridges.

Figure 5D:
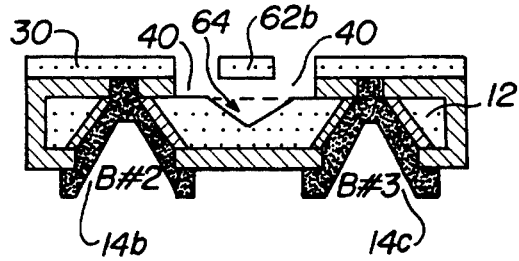
FIG. 5D is a diagrammatic view of the sensor of FIG. 5A taken through cross section 2–2'.

The thermal microbridge sensor illustrates the flexibility of the backside contact scheme of the invention; indeed, this same structure may be adapted for use as a thermal actuator. Such a thermal actuator is useful for, e.g., temperature-based local control of fluid properties like density and reactivity. Here the microbridge is heated to a chosen temperature regime such that the fluid flowing past the bridge is correspondingly heated and its temperature-based characteristics are in turn altered. Additionally, a slightly different sensor operation is achieved when the sensor structure is adapted, as shown in FIG. 5D, which is a cross section through 2–2' of FIG. 5A, to include a groove 64 in the trench 24 under the suspended microbridge. This trench allows for increased fluid flow under the microbridge, and by exposing more substrate area, allows for increased conduction to the substrate. Accordingly, heat conduction to the substrate here becomes the predominant heat loss mechanism for the microbridge. The thermal conductivity of the fluid beneath the resistive bridge is then a function of the ambient pressure, and modulation of the resistance and resulting voltage of the microbridge is a corresponding function of ambient pressure. The behavior of such a device is thus similar to that of a Pirani gauge.

Using the same microbridge sensor structure 60, a temperature sensor is implemented by adjusting the level of current applied across the microbridges 62 such that the elements do not significantly Joule heat, and instead assume the temperature of the ambient. Here then, the resistance of the elements is related to the ambient temperature.

Figure 5E:
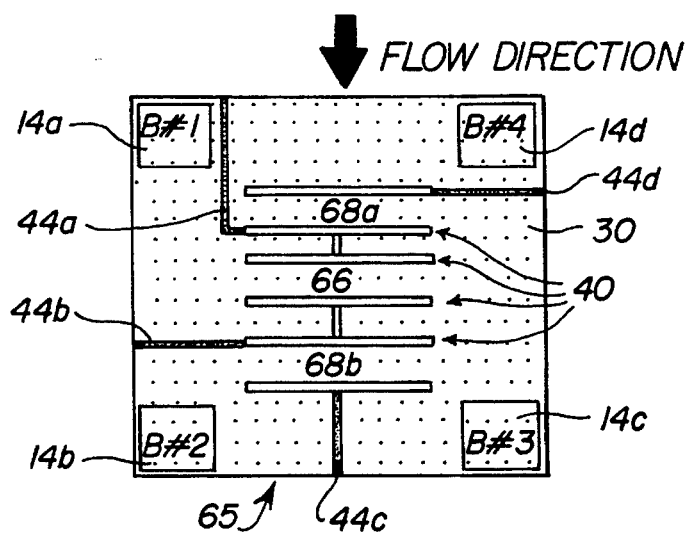
FIG. 5E is a top-down diagram of a temperature and thermal flow rate sensor employing backside contact according to the invention.

Referring to FIG. 5E, a precise flow rate sensor 65 may be produced using a combination of these temperature and flow sensing schemes. In this flow sensor 65 a single thermal actuator microbridge 66 is positioned between two temperature sensing microbridges 68a and 68b. Using a system of isolating trenches 44a–44d, four backside contact vias 14a–14d (shown as B#1–B#4) allow for dielectrically isolated electrical contact across the resistive microbridges such that the bridges are in parallel and may all be tied to a common ground potential with one contact B#3. With this scheme, the temperature sensing microbridges are employed to determine convective heat loss to fluid flow, both upstream and downstream of a thermally actuated microbridge, which operates in the manner described above.

Figure 6A:
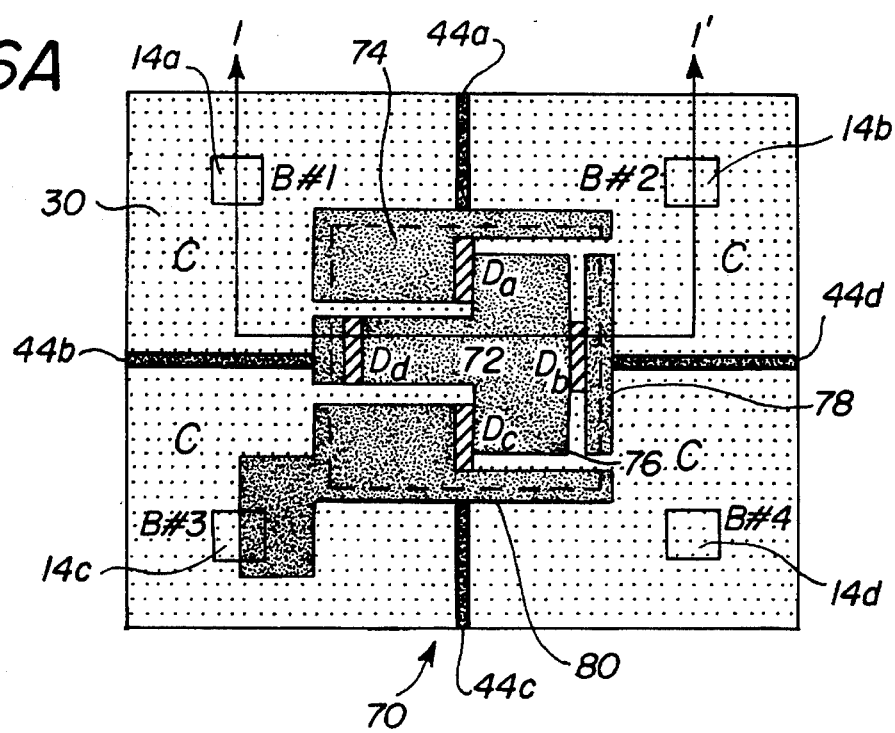
FIG. 6A is a top-down diagram of a piezoresistive pressure sensor employing backside contact according to the invention.
Figure 6B:
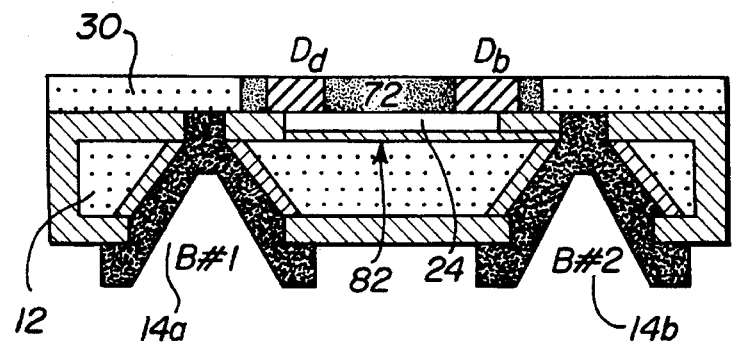
FIG. 6B is a diagrammatic view of the sensor of FIG. 6a taken through cross section 1–1'.

Pressure sensors are yet another example of a class of sensor microstructures that advantageously employ the backside contact scheme of the invention. As shown in FIGS. 6A and 6B, such a pressure sensor 70 consists of a flexible diaphragm 72 suspended over the trench 24 between a support wafer 12 and a sensor structure wafer layer 30 (the edges of the rectangular diaphragm are indicated with a dotted line in FIG. 6A). A combination of trenches 44a–44d in the sensor support substrate 30, doped, e.g., n-type, and oppositely doped junction isolation regions 74, 76, 78, and 80, e.g., p-type, defines a full-bridge circuit configuration for four diffused piezoresistors Da–Dd. FIG. 6B, a view of a cross section taken through 1–1' of FIG. 6A, illustrates the diffused piezoresistors in the junction isolation regions.

Figure 6C:
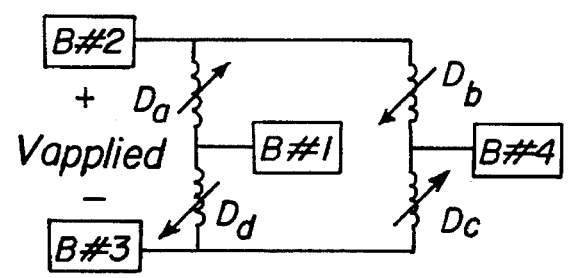
FIG. 6C is a circuit schematic corresponding to the sensor of FIG. 6A.

Referring to FIG. 6C, the full-bridge circuit defined by the piezoresistors transduces a vertical movement of the diaphragm 72 into a measurable electrical signal. When the diaphragm is positioned in an environment such that pressure may be exerted on its top face, pressure-induced deflection of the diaphragm causes a corresponding change in the resistance of the piezoresistors when a voltage is applied between backside contact vias B#2 and B#3 to the resistor bridge. This resistance change is in turn determined by measurements at backside contact vias B#1 and B#4. Thus, the contact scheme of the invention provides an elegant technique for making electrical contact to a flush diaphragm face without extending the sensor substrate surface beyond that face, while at the same time providing backside electrical contact to a piezoresistive bridge positioned on the diaphragm.

As shown in FIG. 6B, the trench 24 under the flexible diaphragm may be coated with a dielectric layer 82 such that touch down of the diaphragm upon reaching the end of its dynamic range does not allow for direct electrical shorting between two piezoresistors, e.g., Dd and Db, as shown in the figure. Other adaptations of the pressure sensor will be understood by those skilled in the art. For example, the shapes and positions of the piezoresistors may be chosen to achieve a precise geometric arrangement; here two of the resistors are parallel to each other and two are transverse to each other. Other piezoresistor shapes and orientations may also be employed. For example, the piezoresistors could comprise deposited, rather than diffused, resistor geometries. Additionally, the resistor geometry may be particularly designed to help linearize the pressure response of the sensor. Further, the pressure sensing scheme may be absolute, as in the case where the trench 24 under the suspended diaphragm is sealed, or may be a differential pressure scheme, achieved by making backside pressure contact, rather than electrical contact, through one of the backside contact vias to the trench.

Figure 7:
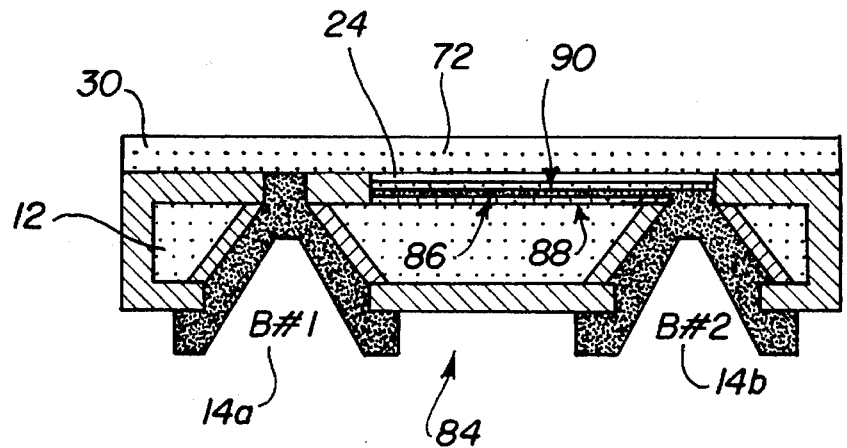
FIG. 7 is a cross sectional diagram of a capacitive pressure sensor employing backside contact according to the invention.

A capacitive, rather than piezoresistive transduction scheme may also be employed for a pressure sensor using the contact structure of the invention. Referring to FIG. 7, a cross section of such a capacitive pressure sensor 84 is illustrated. In this scheme, like the piezoresistive scheme, a flexible diaphragm 72, which is defined by the sensor structure substrate layer 30, is suspended over a trench 24 between that layer and the support wafer 12. A capacitor is defined between the diaphragm 72 and one or more conducting pads 86 positioned in the trench. Application of a voltage across the capacitor is achieved by making electrical contact from a voltage source between a backside contact via 14a that is connected to the diaphragm 72 and a backside contact via 14b that is connected to the conducting pad 86. Pressure-induced deflection of the suspended diaphragm produces a change in capacitance that may be correlated to this deflection.

As will be recognized by those skilled in the art, there are many possible variations in this capacitive geometry. For example, dielectric layers 88, 90 may be formed under and over the trench conducting pad 86, respectively, to isolate the conducting pad from the support wafer and to ensure a minimum dielectric separation when the pressure diaphragm is deflected its full extent to touch the dielectric layer covering the conducting pad. In another possible configuration, the trench conducting pad could be replaced with a conducting region defined by a doped area of the support wafer substrate that is diffused to provide a conducting area flush with the support wafer substrate surface. Similarly, the conducting region could also, e.g., comprise a buried layer that is then inherently dielectrically isolated from the pressure diaphragm. Other variations, relating to, e.g., diaphragm geometry, are also possible.

Figure 8A:
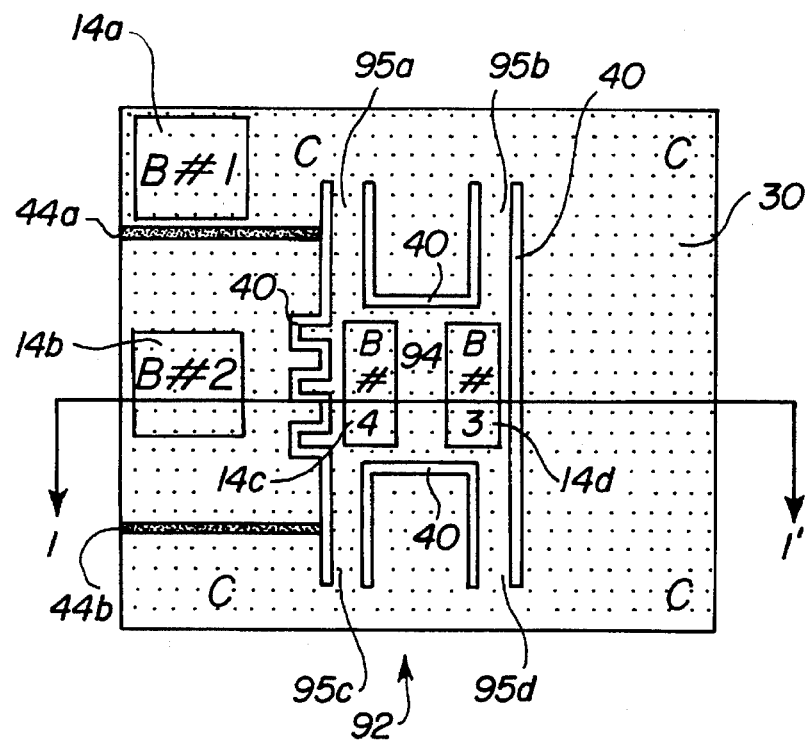
FIG. 8A is a top-down diagram of a resonant microstructure employing backside contact according to the invention.
Figure 8B:
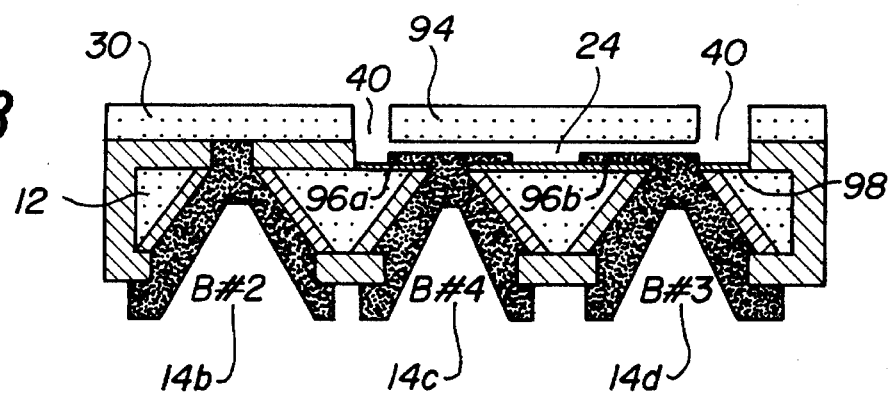
FIG. 8B is a diagrammatic view of the resonant microstructure of FIG. 8A taken through cross section 1–1'.

Turning to a final example of a class of microstructures employing the contact scheme of the invention, there is shown in FIGS. 8A and 8B a resonant microstructure 92 whose design is based on the incorporation of backside contacts. Resonant microstructures, which are operated to resonate in response to an applied AC voltage, provide the ability to sense and monitor various characteristics that alter the quiescent frequency of the microstructure resonance. For example, temperature changes are transduced by resonance frequency changes as a function of Young's modulus of the resonant microstructure and air damping of the microstructure as it moves. Strain changes are also transduced by changes in Young's modulus that result in resonant frequency shifts, and pressure changes are transduced by air damping of the microstructure as it moves. Thus, such a resonant microstructure finds wide applicability and may be designed as part of a multimodal sensor system.

The resonant microstructure 92, referring to FIG. 8, in which a view of a cross section taken through 1–1' of FIG. 8A is shown in FIG. 8B, consists of a floating element 94 suspended over a trench 24 between a support wafer 12 and a sensor structure wafer layer 30. The floating element is tethered by four tether arms 95a–95d to regions of the wafer layer 30 not suspended over the trench. A lateral gap 40 defines the edges of the floating element around the connected tether arms, and allows for lateral motion of the element. As shown in FIG. 8A, this gap may be patterned to produce a comb-like geometry between one or more edges of the floating element 94 and the surrounding wafer substrate; this geometry provides, for a given distance between the ends of the element, proportionally more edge length along which can be generated a resonant attractive force.

Two isolation trenches 44a and 44b provide electrical isolation between two backside contact vias 14a and 14b (shown as B#1 and B#2) such that a voltage applied between these two vias is produced between the floating element structure 94 and the wafer region between the trenches 44a, 44b surrounding the second via B#2. In response to an applied AC voltage, the floating element will correspondingly resonate laterally toward and away from this via B#2, with the equilibrium resonant frequency stabilizing as a function of pressure, temperature, and other characteristics, as discussed above.

Conducting electrodes 96a and 96b may be formed in the trench 24 under the floating element 94 to provide both sensing and control functions. Each of the pads has a corresponding backside contact via 14c and 14d so that isolated electrical contact may be made to each of the pads. A dielectric layer 98 may be formed under the conducting pads to further ensure electrical isolation between the pads. The floating element 94 forms a capacitor with each of the pads when a voltage is applied between the microstructure backside via 14a and the conducting pads' backside vias 14c and 14d. This capacitance changes in response to the lateral resonant movement of the floating element, and so provides a means for sensing the time-dependent position of the floating element. Additionally, the conducting pad placement may be chosen to provide control of out-of-plane motion of the floating element in its resonant trajectory; using a feedback loop scheme, the capacitor voltage may be adjusted to pull the floating element back to a desired motion in response to the sensing of an unacceptable trajectory.

It is seen by this example that the backside contact scheme of the invention provides great flexibility in the design of a sensor system that combines actuation, sensing, and control functions in one microstructure. Indeed, in each of the examples discussed, it is shown that the contact scheme of the invention, by virtue of its ability to electrically isolate adjacent regions of a sensor structure wafer as well as regions of the microstructure itself, is quite flexible, and yet in every example does not require any electrode or conducting layer on the top side of the microstructure. Thus, the contact scheme ensures that unobstructed positioning of a sensor in an environment to be sensed is achievable.

Fabrication of the contact scheme of the invention is based on a straightforward process flow that is easily adapted for a specifically desired sensor microstructure. One such process flow will be discussed in detail, to highlight features and advantages of the invention, but this example process flow is not meant to limit the scope of the invention to this one embodiment.

Referring to FIG. 9, showing cross sectional views of the process flow, a support wafer structure with backside contact vias is first fabricated, before fabrication of a sensor microstructure. In a silicon-based process, a <100> single-crystal, double-side polished silicon wafer 12, phosphorus-doped between 0.5–2.0 $\Omega$-cm, and ranging between 500–550 µm-thick is used as the starting substrate. This support wafer is oxidized at 1000° C. in a steam ambient to thermally grow a 1 µm-thick silicon dioxide layer 16. Using photolithographic techniques, one or more windows are patterned in the oxide layer on front side 15 of the support wafer to define one or more trenches 24 in the oxide layer. These trenches, over which the sensor microstructure will be suspended, are aligned with respect to the wafer flat, e.g., to the <110> crystal planes, for later alignment reference. Using wet buffered HF or dry anisotropic etching, the oxide layer is etched to open the patterned windows and produce the trenches, as shown in FIG. 9A. Such dry, i.e., plasma, etching may be carried out in, for example, a LAM 594 Plasma Etcher, using a $CHF_3/CF_4$ based anisotropic oxide etch recipe. At this point in the process, the trench may be grooved, using, e.g., an anisotropic or dry etch procedure, to define a groove or other desired topography in the trench.

Then, using a sequence of photolithographic and etching techniques, one or more contact openings 22 in the oxide layer are formed on the back side 17 of the support wafer. These opening are used both in later processing steps and sensor operation for making electrical contact to the support wafer. The positioning of the backside openings is aligned, using an infrared aligner, to the oxide trenches 24 on the front side of the wafer.

Figure 9A:
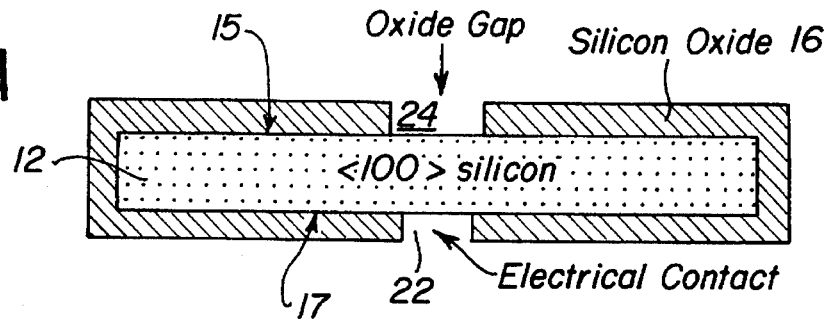
FIGS. 9A–9J are cross sectional diagrams illustrating fabrication steps for fabricating a sensor microstructure employing backside contact according to the invention.
Figure 9B:
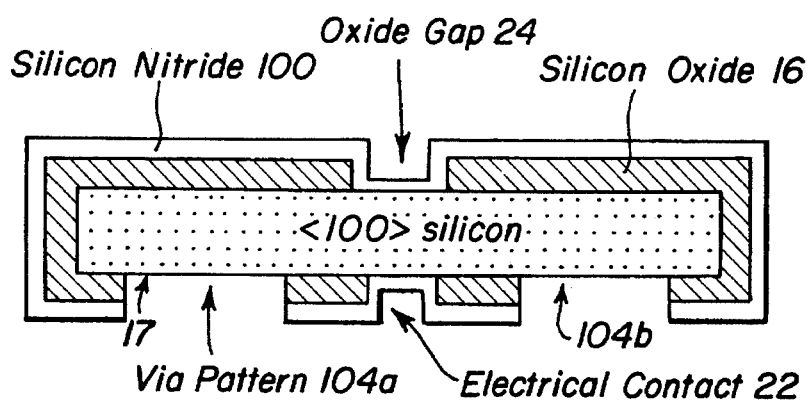

The support wafer is then coated with an LPCVD silicon nitride layer of about 1500 A in thickness, that will later act as an etch mask during anisotropic etching of the silicon substrate 12 to define the through-wafer vias. The backside 17 of the substrate is patterned, using photolithographic techniques, to define locations of the through-wafer vias on the back surface. The silicon nitride layer is then dry etched, e.g., in a LAM 480 Plasma Etcher, to produce via patterns 104a and 104b, as shown in FIG. 9B, using an $SF_6$/HE-based etch recipe, or other suitable recipe. The underlying 1 μm-thick oxide layer exposed in the via patterns 104a, 104b, is then wet etched using buffered HF to open the via patterns and expose the backside 17 of the substrate. Like the contact openings 24, the via patterns 104a and 104b are aligned, using an infrared aligner, to the oxide trenches 24 on the front surface 15 of the substrate.

Anisotropic silicon etching is used to form the through-wafer via holes with, e.g., at $KOH:H_2O$ or other etching solution. Using KOH, the patterned support wafer 12 is placed in a polypropylene cassette and immersed in a stainless steel tub filled with a $KOH:H_2O$ solution. The tub is placed in a water bath with temperature control of ±0.1° C. The concentration of the KOH-water solution is 20% by weight prepared by dissolving KOH pellets in 4 liters of 18 MΩ-cm deionized water. At this concentration, silicon has the highest etch rate, for a given temperature. To reduce the amount of hydrogen bubbles that naturally evolve during the etch—such bubbles tend to build up on the wafer surface and can cause surface roughness—about 16 drops of a fluorochemical surfactant, such as Fluorad FC-129, available from the 3M Corp., are added to the KOH-water solution.

Figure 9C:
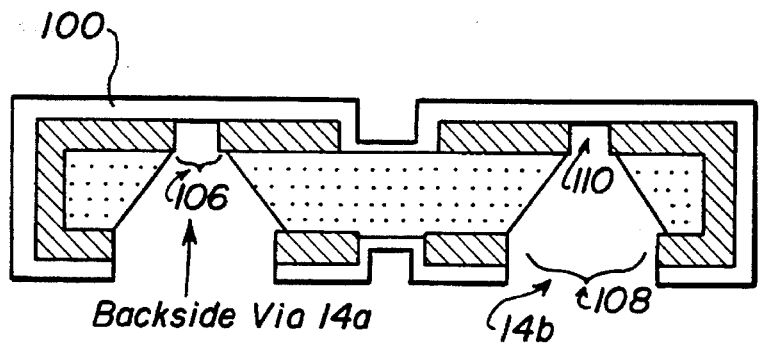

To form the through-wafer via holes, the support substrate is first dipped in a dilute $HF:H_2O$ solution to remove the native silicon oxide on the surface. Then the wafer is etched in the 20% KOH solution, at a temperature of about 60° C., for between 21–24 hours. Halfway through the etch period, the substrate is rotated to improve the overall etch uniformity. The anisotropic etch terminates on the 1 μm-thick oxide layer at the top of the via openings on the front surface 15 of the wafer (not shown). As shown in FIG. 9C, the <111> crystal planes of the substrate form 54.7° tapered sidewalls for the vias, with the opening 106 at the front surface of the substrate therefore being more narrow than the opening 108 at the back surface of the substrate; the frontside via opening may be, for example, 96 μm across while the backside via opening would be, for example, about 800 μm across. The 1 μm-thick oxide layer at the top of the via openings on the front surface 15 of the wafer are removed using a buffered HF wet etch. The silicon nitride coating 100 protects the rest of the underlying oxide that is not aligned with the via opening from being etched. After this oxide etch, the via openings at the front surface of the substrate are covered only by the nitride layer 100.

The support wafer substrate is then cleaned by rinsing it first in deionized water for 10 mins., next performing a 10 min. Piranha clean, comprising, e.g., a 3:1 sulfuric acid:hydrogen peroxide solution, rinsing for 6 min. in deionized water, dipping, for 20 secs. in a 50:1 $H_2O:HF$ solution, rinsing for 6 min. in deionized water, and lastly, performing an RCA cleaning.

Figure 9D:
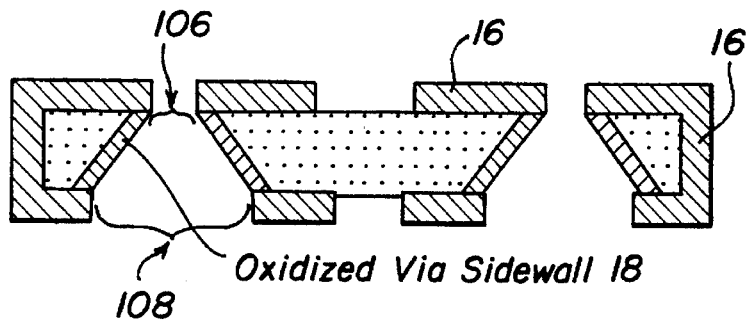

The exposed <111> sidewalls of the through-wafer vias are then oxidized to form a dielectric layer 18 on them, as shown in FIG. 9D. This oxidation process may be, e.g., a 950° C. steam oxidation, producing a 7000 A-thick oxide layer. The silicon nitride layer 100 acts as an oxidation barrier for the underlying trenches 24 and backside openings 22 in the substrate. The silicon nitride layer is then removed using a selective wet etch of a 190° C. phosphoric acid solution. With this removal, only the insulating oxide layer remains on the substrate surfaces, including the via sidewalls, as shown in FIG. 9D.

At this point in the process flow, there is a large area of exposed silicon dioxide on the <111> sidewalls of the through-wafer vias. This large area increases the likelihood that some oxide defects are present at points throughout the oxidized area. Such defects may provide parasitic electrical conduction paths between adjacent vias, through the support wafer, and thus may affect the overall function yield of a sensor system produced with this process flow. Accordingly, to improve the yield, a conformal LPCVD silicon nitride coating of between about 1500 A–3000 A in thickness may be deposited to encapsulate the substrate and vias (shown before such deposition in FIG. 9D). Such a nitride coating would form a nitride/oxide composite dielectric on the substrate and via sidewalls which would reduce the overall defect density of the dielectric film.

At this point in the process flow, the fabricated substrate wafer may be used for many sensor design applications, such as the piezoresistive shear stress sensor, microbridge sensors, and piezoresistive pressure sensor discussed previously. Alternatively, if a capacitive-based sensor design, relying on a conducting pad scheme is desired, as in the case of the capacitive shear stress sensor, capacitive pressure sensor, and resonant microstructures discussed above, a variant of this process flow is used.

Referring now to FIG. 10, showing cross sectional views of such a process flow, the support wafer substrate is fabricated using, e.g., a <100> single-crystal silicon wafer with the characteristics given as in the above process flow. This support substrate 12 is oxidized at 1000° C. to grow a 1 μm-thick silicon dioxide layer 16 on the wafer. Then, using photolithographic techniques, one or more trenches 24 are patterned on the oxide layer on the front side 15 of the support substrate, as shown in FIG. 10A. The trenches are positioned to be aligned with the wafer flat, as explained previously. Using a buffered HF or dry plasma etch, the trenches are then etched to expose the front side 15 of the wafer substrate. The exposed silicon in the trenches is then dry etched, e.g., in a LAM 480 Plasma Etcher, using a $SF_6/CCl_4$-based etch recipe, for example, to remove about 1–2 μm of silicon, so that the base 112 of the trench is several microns below the surface of the wafer substrate surface 15. These trenches define the location of one or more conducting pads, over which a suspended microstructure will be formed in later process steps.

Next, a 1400 A–2500 A-thick thermal oxide 114 is grown on the exposed trench bases 112 and a 1500 A-thick conformal LPCVD silicon nitride layer 100 is deposited on the entire substrate. A 3000 A–5000 A-thick LPCVD polysilicon electrode layer is then deposited and $POCl_3$ doped. Photolithographic techniques and dry etching steps are then used to define an electrode 116 in the trench 24, sitting atop the nitride layer 100; the polysilicon is thus removed from all other areas of the substrate. An $SF_6$ plasma etch recipe, e.g., may be used to etch the polysilicon. The nitride layer 100 and oxide layer 114 together form a composite insulator and etch-stop layer beneath the polysilicon electrodes, such that these dielectric layers remain in place once the electrodes are defined, and provide dielectric insulation between the electrodes.

Figure 10A:
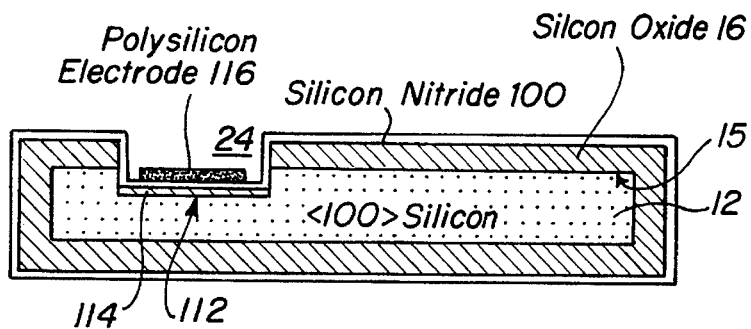
FIGS. 10A–10E are cross sectional diagrams illustrating fabrication of a microstructure for use in a capacitive sensor employing backside contact according to the invention.
Figure 10B:
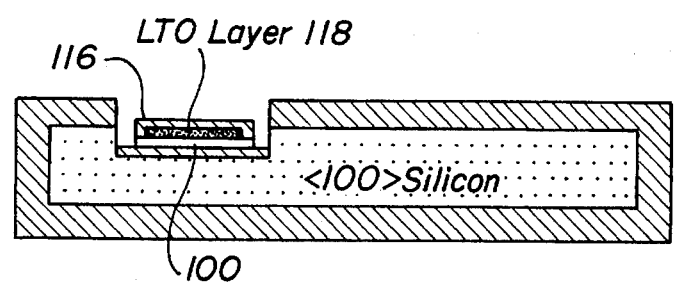

Next, referring to FIG. 10B, a low-temperature LPCVD oxide passivation layer is formed, in a 450° C. process, to produce a film of about 2000 A in thickness. Photolithographic techniques and buffered HF etching are then used to pattern the LTO passivation layer such that it encapsulates only the polysilicon electrodes 116. Nitride remaining in the trench around the electrode periphery is then removed using a selective phosphoric acid etch solution. Here, the LTO passivation acts as an etch mask for the polysilicon electrodes, whereby the nitride layer is left remaining only directly under the polysilicon electrodes 116. The substrate is then annealed at 1000° C. for about 1 hour in a nitrogen ambient to densify the LTO layer and to allow the LTO and doped polysilicon layers to outgas.

At this point in the process flow, as in the process first described, photolithographic and etch techniques may be used to define contact openings on the back surface of the support wafer substrate for making electrical contact directly to the support wafer during later process steps and during electrical sensor operation.

Figure 10C:
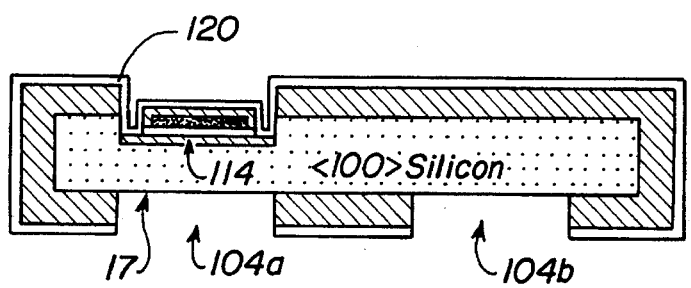
Figure 10D:
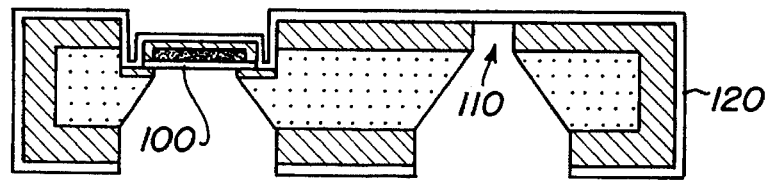

Referring to FIG. 10C, the substrate is then conformally coated with a 1500 A-thick LPCVD silicon nitride film 120; this will act as an etch mask during etching of the through-wafer vias. In this etch process, the backside 17 of the substrate is patterned to define the via locations on the backside, and the nitride and oxide layers 120 and 16, respectively, are removed to create the via patterns 104a, 104b. The vias are anisotropically etched, using, e.g., the process outlined above, after which the oxide layer 114 remaining under the polysilicon electrode 116 and the oxide layer 16 remaining at the front side opening 110 of the vias is removed, as shown in FIG. 10D.

Figure 10E:
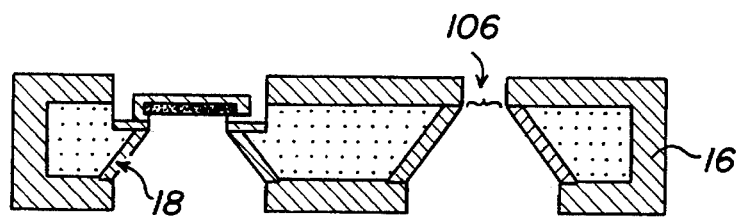

After following the cleaning procedure given above, the via sidewalls are oxidized to form a 7000 A-thick oxide layer 18 on the sidewalls, as shown in FIG. 10E. The silicon nitride layer 100 is then removed from under the polysilicon electrode and the rest of the substrate using a phosphoric acid etch solution. Then, at this point, the support substrate is ready for fabrication of a corresponding sensor microstructure.

Figure 9E:
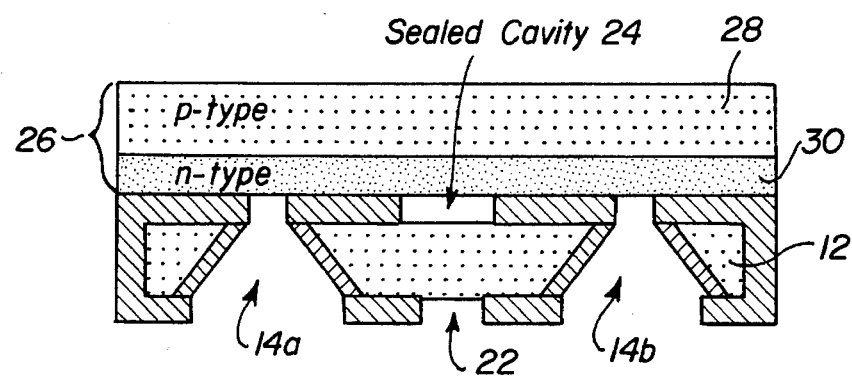

Referring now to FIG. 9E, a sensor microstructure fabrication procedure will be described using a sensor structure wafer and the support wafer substrate fabricated by the first process flow described (shown in FIGS. 9A–9D), but it must be recognized that the support wafer substrate just described (shown in FIGS. 10A–10E), which includes a conducting pad structure, could equally well be used in this process flow. In the process to be described, a second single-crystal silicon substrate 26, forming the sensor structure wafer, which has been selected and processed based on later process requirements, as described below, is high-temperature direct wafer bonded to the support wafer substrate 12.

In this wafer bonding process, the two wafers 12 and 26 are first RCA cleaned to significantly hydrate their surfaces. Following this step, the wafers are rinsed in deionized water and spin dried. The wafers are then loaded into a spin-bonding apparatus which allows the front side of the processed support wafer 12 to be brought into intimate contact with the front side of the sensor structure wafer 26, to thereby bond the two wafers together in a controlled ambient, such as oxygen, nitrogen, or an oxygen/nitrogen mixture. The direct wafer bonding is made possible by the mirror smoothness of the frontside of the support wafer and the polished surface of the sensor structure wafer, and by the high concentration of the OH groups on the wafer surfaces due to the hydrating nature of the RCA clean. The mirror smoothness of the two surfaces allows the intimate contact to be made such that the OH groups on the surfaces are attracted to each other and a hydrophilic reaction takes place between the two wafer surfaces.

Once the two wafers have been brought into contact, the wafer combination is annealed in a high-temperature cycle consisted of 70 mins. in nitrogen at 1000° C. Preferably, the temperature is gradually increased from a first temperature of about 600° C. to the 1000° C. anneal temperature. Likewise, at the end of the anneal cycle, the temperature is decreased from the 1000° C. anneal temperature to 800° C. before removing the wafer pair from the annealing furnace. This process is preferred to ensure that no large temperature gradient exists between the wafers and the furnace ambient that could result in large thermal stress in the wafer pair. Once this annealing step is complete, the wafer pair is found to be completely bonded, as shown in FIG. 9E. This particular bonding technique is known as high-temperature (fusion) bonding. This produces a wafer bond that is strong enough to allow plastic deformation without the two wafers coming apart. It will be understood, however, that other bonding techniques, such as anodic bonding, may also be used.

Figure 9F:
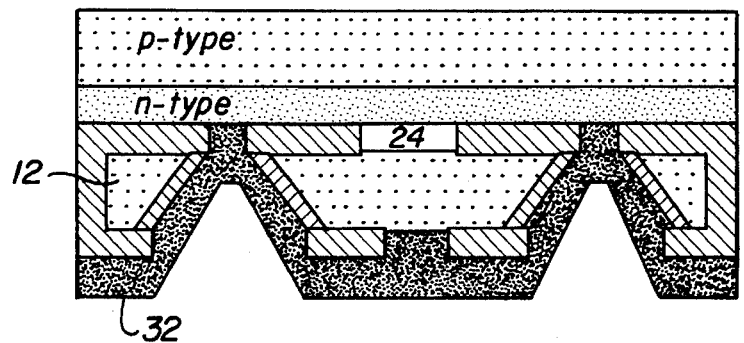

At this point, a 2.5 μm-thick polysilicon layer 32 is LPCVD deposited and $POCl_3$ doped to form electrical connection through the vias 14a, 14b to the sensor structure wafer 26, as well as electrical connection to the backside of the support wafer 12 through any backside openings 22, as shown in FIG. 9F.

Figure 9G:
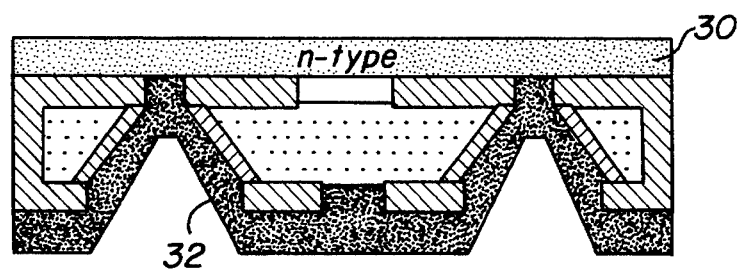

Next, the sensor structure wafer is processed to produce a moveable microsensor structure. The method preferred for this processing determines the starting characteristics for the sensor structure wafer, as mentioned previously. In this processing step, using any of a number of possible processes, the sensor structure wafer is thinned back to produce about a 5 μm-thick n-type wafer layer 30, in which a moveable microstructure is defined, as shown in FIG. 9G. In one possible technique, an electrochemical etch stop is used to achieve the desired wafer layer 30. For this process, the starting sensor structure wafer would be a double-side polished, <100> single-crystal silicon wafer that is boron doped to between 10–20 Ω-cm, and is between 500–550 μm-thick. Before any other processing, this wafer is first oxidized at 960° C. to produce a 450 A-thick implant oxide, and a $1.4e^{13} cm^{-2}$ ion implantation of phosphorus is done on the front surface of the wafer, at an energy of 180 KeV and a 7° tilt. The phosphorus implant is then driven to a depth of about 5 μm in a nitrogen ambient at 1150° C., which takes about 1250 mins. The implant oxide is then stripped from the doped layer using a buffered HF etch. The doping profile of this n-type diffusion layer defines the doping and other electrical characteristics of the resulting microstructure, for example, the resistance of the piezoresistors, typically with a sheet resistance of between 500 and 1000 Ω/square.

Alternatively, if an oxide etch stop technique is to be used for thinning back the sensor structure wafer, the starting sensor structure wafer may be a silicon-on-insulator wafer (SOI), with a 3–5 μm-thick n-type <100> silicon epitaxial layer stacked on top of a 0.5–1 μm-thick oxide layer and a lower 500–550 μm-thick silicon substrate. Here, the doping of the silicon n-type epitaxial layer will define the doping characteristics of the sensor microstructure. Finally, if a chemical etch stop technique is to be used for thinning back the sensor structure wafer, the starting sensor structure wafer may be a p-type silicon substrate in which a thin p++ boron etch stop layer is diffused and over which a 5 μm-thick n-type <100> silicon epitaxial layer is grown. Here as well, then, the n-type epitaxial layer will define the doping characteristics of the sensor microstructure.

Referring back to FIG. 9G, using an electrochemical etch stop technique, the bonded sensor structure wafer is etched back to the junction of the p and n-type layers 28, and 30, in a KOH:$H_2O$ solution. The electrochemical etching is carried out in a polypropylene tub filled with 4 liters of 20% by weight KOH:$H_2O$ solution. The tub is placed in a water bath and heated to 95° C. with temperature control of ±0.1° C. To reduce the tendency of the surface roughening during the etch, about 16 drops of a fluorochemical surfactant, for example the Fluorad FC-129 product mentioned previously, are added to the KOH-water solution. An electrochemical voltage is applied to the etching wafer and the resulting electrical current is monitored using, e.g., a computer-controlled EG&G Princeton Applied Research Model 273 Potentiostat/Galvanostat. The applied potentials are referenced with respect to a Fishcher Scientific, double-junction, silver/silver chloride reference electrode (e.g., model #13-620-273), and a solid platinum foil counter electrode. The bonded wafer pair is first dipped in a dilute HF:$H_2O$ solution to remove the native silicon dioxide, rinsed in deionized water, and then loaded into a one-sided Teflon etching jig.

The wafer pair is held in place in the jig using a vacuum O-ring seal which protects most of the backside of the support wafer substrate 12 from the etching solution. Spring-loaded electrical contacts in the jig make electrical contact to the conducting layer 32 on the backside of the support wafer substrate 12, whereby electrical contact to the support wafer substrate is secured (through the opening 22 in the oxide layer on the back side of the support wafer), as well as electrical contact to the sensor structure wafer, through the backside contact vias. It is thus seen here what advantage in processing is gained by first fabricating the support wafer substrate and backside vias before the wafer bonding and sensor structure wafer fabrication steps.

Once loaded in the jig, the wafer pair is then placed in the KOH:$H_2O$ etching solution under constant applied voltage bias for about 3.5–5 hours. The progress of the etch is monitored through the potentiostat. When the current reaches its peak passivation value and returns to a plateau, the wafer pair is pulled from the solution; this plateau indicates that the etch has self-terminated due to formation of an anodic oxide on the n-type layer 30.

In an alternative wafer thinning process, using an oxide etch stop technique, the bonded wafer pairs are mounted on the Teflon etch jig described above, and the pair is placed in a 95° C., 20% by weight KOH:$H_2O$ etching solution. The pair is maintained in the solution for about 3.5–5 hours to remove all of the 500–550 μ-thick silicon substrate (of the SOI wafer), ending at the 0.5–1 μm-thick oxide layer of the SOI wafer. Then the wafer pair, remaining in the jig, is etched in a buffered HF solution for about 7–15 mins. to selectively remove this oxide layer. At the end of this etch, the remaining 5 μm-thick n-type epitaxial layer remains as the sensor structure layer 30. As will be recognized by those skilled in the art, a chemical etch stop technique or other technique may alternatively be used to thin the sensor structure wafer and produce an n-type wafer layer in which a moveable sensor microstructure is fabricated.

At this point it should be mentioned that during the wafer spin-bonding step, described above, an oxygen ambient is preferably used to ensure that this becomes the ambient within the sealed cavity 24, which is actually defined by the trench 24 and the front surface of the bonded sensor structure wafer 26. During the wafer bonding anneal step, most of the oxygen gas trapped within the cavity 24 is consumed to form a thin silicon oxide coating inside the sealed cavity. This oxygen consumption reduces the pressure of the residual ambient gas trapped within the sealed cavity. The resulting low pressure, typically about 0.2–0.4 atm, within the cavity prevents the 5 μm-thick sensor structure layer 30 from rupturing or plastically deforming during the process steps that follow this wafer thinning step.

Figure 9H:
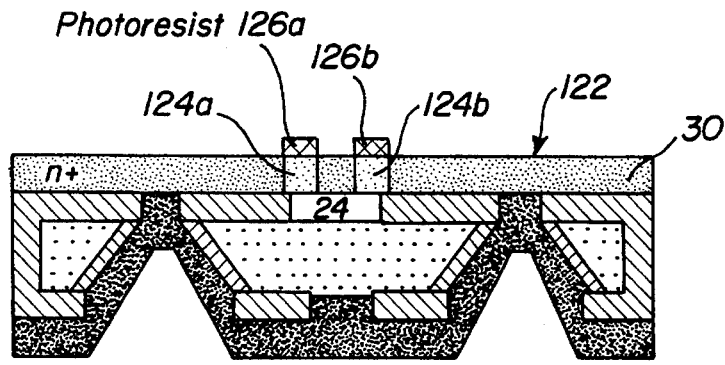

Regardless of the selective thinning technique used, the bonded wafer pair is subsequently cleaned following the multi-step cleaning process outlined above. Then a photolithographic step is begun to electrically n+ dope the backside 122 of the sensor structure wafer layer 30 in areas that are to be defined as the electrically isolated regions corresponding to the through-wafer vias (discussed above in connection with specific sensor designs). Depending on the desired microstructure to be fabricated, portions 124a, 124b of the wafer layer 30 over the trench cavity 24 may be masked from this doping, as shown in FIG. 9H; for example, areas of the layer 30 to be defined as piezoresistive tether arms for a floating element are masked. In this way, the isolated regions provide good conductivity for contact made through the backside vias to the regions.

First, a thin, 450 A-thick implant oxide is grown on the back surface 122 of the wafer layer 30, using a dry thermal oxidation process at 950° C. Then a thick, on the order of 2 μm, photoresist layer 126a, 126b, is deposited and patterned in relation to the portions 124a, 124b to be shielded from the implant, as shown in FIG. 9H. A $1e^{16} cm^{-2}$ phosphorus ion implant, at an energy of about 180 KeV and a 7° tilt is then accomplished to dope the isolated sensor structure regions. A thermal anneal step in a nitrogen ambient at 1150° C., for at least 400 mins., is then followed to electrically activate the dopants and to drive them through the full 5 μm of the sensor structure layer 30 such that good electric contact may be made to the regions from corresponding backside contact vias. The implant oxide is removed using a buffered HF etch.

Next, using photolithographic techniques, regions 40 of the sensor structure layer 30 that are to form lateral gaps 40 around the sensor microstructure, as well as regions (not shown) that are to form the electrical isolation trenches between substrate regions are defined. The geometry of the gaps 40 and trenches is aligned, using an infrared aligner, to the trench 24 between the two bonded wafers. Using a thick, on the order of 2.5 μm-thick, photoresist etch mask, an $SF_6$:$CCl_4$ plasma etch is then used to remove the silicon in those regions and thus define the gaps and trenches. This etch recipe is preferred for silicon trench etch etching because of its acceptable undercutting for deep trench patterns, good reproducibility, and reasonable etch selectivity with the photoresist etch mask, rather than requiring the use of a hard etch mask such as a metal. This etch may be accomplished using, e.g., a LAM 480 Plasma Etcher.

Figure 9I:
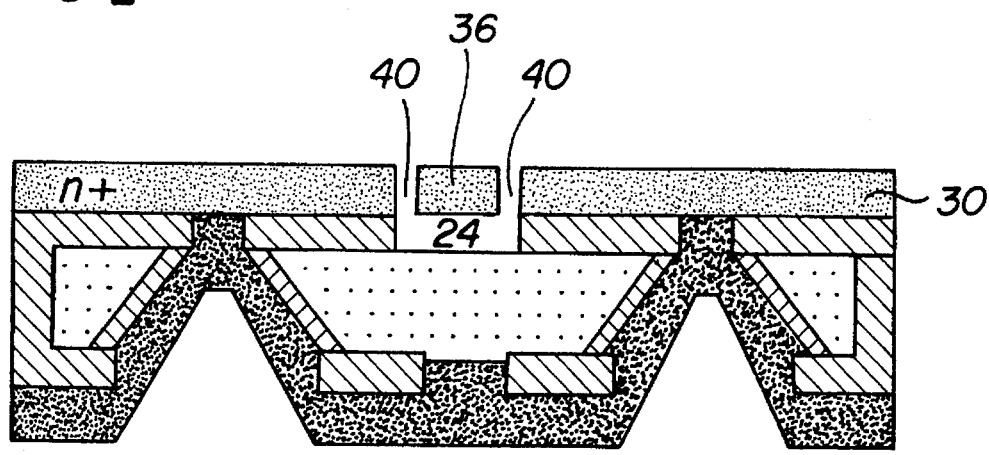
Figure 9J:
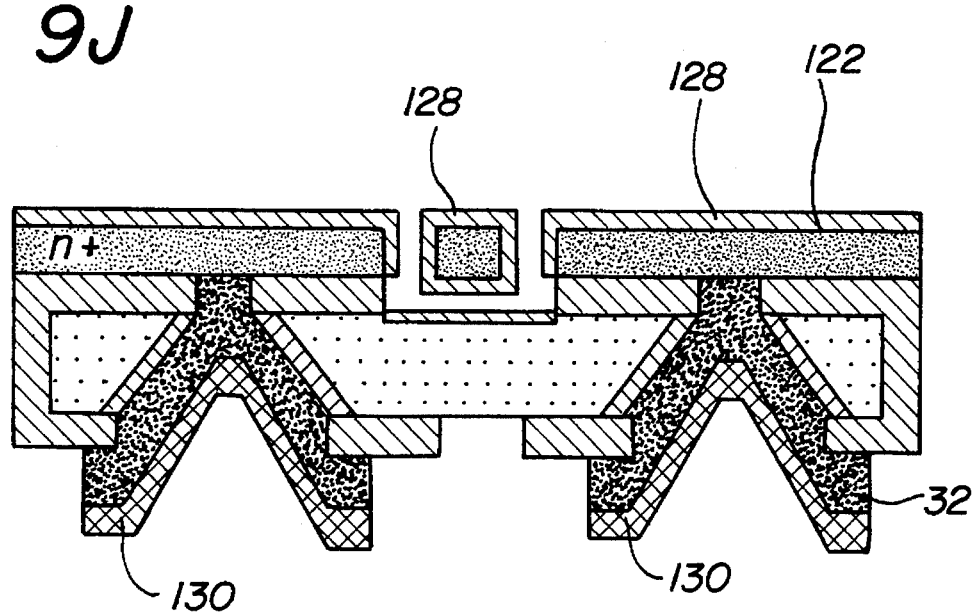

Referring to FIG. 9I, at this point in the process, a floating element microstructure 36 is defined in the sensor structure layer 30 and is connected to various electrically isolated regions of the sensor structure substrate in a scheme like, e.g., the piezoresistive shear stress sensor described earlier. A three-dimensional passivation layer 128 may now be thermally grown on the released floating element, as shown in FIG. 9J, to improve the electrical characteristics of both any piezoresistors on the element and the isolated substrate regions. This thin passivation oxide, about 450 A in thickness, is grown using a dry thermal oxidation at 950° C. Thicker passivation oxides or LPCVD dielectrics could also be used.

The passivation layer on the sensor structure substrate is then conformally coated with a thick photoresist layer for masking during a following backside contact deposition step. Once the photoresist is in place, the wafer pair is dipped in a buffered HF solution to remove native oxide that has grown on the polysilicon contact layer 32. A metallization layer 130, as shown in FIG. 9J, may then be deposited on this polysilicon layer to facilitate external lead attachment to the backside contact vias. Such a metal layer may comprise 1 μm of aluminum, or other metal, such as titanium, gold, chromium, or a silicide, and may be deposited using e-beam evaporation, sputtering, or other suitable deposition technique. One important consideration in selection of a particular metal layer is the expected operating temperature of the sensor— a metal capable of withstanding a high temperature, i.e., a temperature at least as high as the operating environment, is best selected.

Multiple photolithographic steps, each using a thick photoresist layer, on the order of 5–10 μm-thick, are then completed to achieve adequate step coverage for defining backside via contact pads, which are aligned so that they are each centered about a corresponding via. The exposed aluminum metallization is then removed in a standard phosphoric acid-acetic acid-nitric acid, 40° C. Transene PAN etch for 4–5 mins. The wafer pair is then rinsed in deionized water and the now exposed polysilicon layer is removed using an $SF_6$ plasma etch so that the polysilicon remains only under the metal locations.

All of the photoresist layers are then removed in a 30 min. oxygen plasma strip, followed by a 12–18 hour acetone soak, a 20 min. methanol soak, a 20 min. propanol soak, and a 30 min. oxygen plasma strip. The aluminum layer is then sintered in forming gas at about 375° C. for 20 mins. to anneal the ohmic contacts. At this point, the processing is complete and the floating element sensor microstructure is moveable. Where multiple sensor are fabricated on the same wafer, the wafer is diced into individual chips accordingly.

Whether fabricating a piezoresistive, capacitive, or other type of sensor microstructure, it is thus seen that the backside contact scheme of the invention is readily applicable to a wide range of sensor schemes. As will be recognized by those skilled in the art, variations of both the backside via contact structure and fabrication process are within the scope of the invention. Accordingly, the invention is not meant to be limited to only this description, but by the spirit and scope of the claims.

We claim:

1. A microelectromechanical sensor body and support structure for backside contact of the sensor body, comprising:

a support wafer substrate having at least one through-wafer via with a lateral span on an order of microns and vertically extending from a front surface to a back surface of the support wafer substrate, the lateral via span at the front surface being more narrow than the lateral via span at the back surface, an insulating film covering at least a portion of the support wafer substrate and covering sidewalls of the vias with the lateral via span at the front surface being open, and a sensor body wafer substrate adapted to define a mechanical sensor microstructure, the sensor body wafer substrate comprising a plurality of substrate regions, each of the support wafer substrate through-wafer vias corresponding to a substrate region and at least one of the substrate regions being circumscribed by an edge of the mechanical sensor microstructure and an isolating border region, the sensor body wafer substrate having a front surface bonded to the front surface of the support wafer substrate, such that contact of the front surface of the sensor body wafer substrate may be made through a support wafer substrate via from the back surface of the support wafer substrate, contact made through one of the support wafer substrate through-wafer vias to the corresponding one of the sensor body substrate regions being isolated and thereby prevented from making contact to any other sensor body substrate region except through the sensor microstructure.

2. The sensor body and support structure of claim 1 wherein the isolating border regions circumscribing isolated sensor body wafer substrate regions each comprise a trench in the sensor body wafer substrate, the trench exposing the support wafer substrate, such that contact made through one of the support wafer substrate through-wafer vias to the corresponding one of the sensor body substrate regions is isolated by the trenches and thereby prevented from making contact to any other sensor body substrate region except through the sensor microstructure.

3. The sensor body and support structure of claim 2 wherein each of the sensor body substrate regions comprises a conducting region that is electrically isolated from the other conducting regions by the trench circumscribing the region, whereby electrical contact made through one of the support wafer substrate through-wafer vias to the corresponding one of the sensor body substrate conducting regions is prevented from making electrical contact to any other sensor body substrate region except through the sensor microstructure.

4. The sensor body and support structure of claim 1 wherein the support wafer substrate through-wafer vias are formed by a fabrication process in which the vias are first formed and then the sensor body wafer substrate is bonded to the support wafer substrate.

5. The sensor body and support structure of claim 4 wherein the mechanical sensor microstructure is formed by a fabrication process in which the microstructure is formed after the sensor body wafer substrate is bonded to the support wafer substrate.

6. The sensor body and support structure of claim 1 wherein mechanical contact is made to the sensor body wafer substrate through the support wafer vias.

7. The sensor body and support structure of claim 1 wherein fluid contact is made to the sensor body wafer substrate through the support wafer vias.

8. The sensor body and support structure of claim 1 wherein electrical contact is made to the sensor body wafer substrate through the support wafer vias.

9. The sensor body and support structure of claim 8 wherein a conducting film covers the insulating film on the sidewalls of the through-wafer vias.

10. The sensor body and support structure of claim 1 wherein the support wafer substrate and the sensor body wafer substrate each comprises a silicon substrate and the insulating film covering at least a portion of the support wafer substrate comprises an oxide film, and further comprising a polycrystalline conducting film covering the oxide film on the sidewalls of the through-wafer vias.

11. The sensor body and support structure of claim 10 further comprising a high-temperature conducting film covering the polycrystalline conducting film on the sidewalls of the through-wafer vias.

12. The sensor body and support structure of claim 10 wherein the oxide film covering the support wafer substrate includes an opening in the oxide film on the front surface of the support wafer substrate, the opening exposing the front surface of the support wafer substrate and resulting in a trench, defined by the opening, over which the mechanical sensor body microstructure is suspended.

13. The sensor body and support structure of claim 12 wherein the front surface of the support wafer substrate exposed by the opening in the oxide film is grooved to extend the trench over which the mechanical sensor body microstructure is suspended to a depth below the front surface of the support wafer substrate.

14. The sensor body and support structure of claim 10 wherein the front surface of the sensor body wafer substrate is doped to provide an etch stop layer, such that etching of the back surface of the sensor body wafer substrate terminates at the doped etch stop layer.

15. The sensor body and support structure of claim 10 wherein the front surface of the sensor body wafer substrate comprises an insulating dielectric etch stop layer, such that etching of the back surface of the sensor body wafer substrate terminates at the dielectric etch stop layer.

16. The sensor body and support structure of claim 14 wherein the oxide film covering the support wafer substrate includes an opening in the oxide film on the back surface of the support wafer substrate, the opening exposing the back surface such that electrical contact may be made to the support wafer substrate through the opening.

17. The sensor body and support structure of claim 12 wherein the mechanical sensor body microstructure comprises a plate having a thickness on an order of microns suspended over the trench in the oxide film on the support wafer substrate front surface.

18. The sensor body and support structure of claim 17 wherein the plate comprises a floating element, first selected peripheral portions of which are released from surrounding areas of the sensor body wafer substrate and second selected portions of which are each tethered by an arm to a corresponding one of the isolated sensor body substrate regions, such that electrical contact made through one of the support wafer substrate through-wafer vias to the corresponding one of the sensor body substrate regions and tether arms is isolated and thereby prevented from making contact to any other sensor body substrate region and tether arm except through the floating element, the floating element being free to move laterally in response to an applied force in a direction parallel to the front surface of the sensor body wafer substrate.

19. The sensor body and support structure of claim 18 wherein the floating element comprises a shear stress sensor tethered by a plurality of arms, at least two of the arms being electrically doped to define piezoresistive elements on the arms, each piezoresistive element exhibiting a characteristic resistance that changes resistivity in response to lateral movements of the floating element when a voltage is applied across the tether arms by electrical contact from the back surface of the support wafer substrate through the support wafer vias to the corresponding isolated sensor body substrate regions and tether arms.

20. The sensor body and support structure of claim 17 wherein the plate comprises a plurality of distinct floating elements forming a shear stress sensor, first selected peripheral portions of each of the floating elements being released from surrounding areas of the sensor body wafer substrate and second selected portions each of which are tethered by an arm to a corresponding one of the isolated sensor body substrate regions, such that electrical contact made through one of the support wafer substrate through-wafer vias to the corresponding one of the sensor body substrate regions and tether arms is isolated and thereby prevented from making contact to any other sensor body substrate region and tether arm except through a floating element, each floating element being free to move laterally in response to force in a direction parallel to the front surface of the sensor body wafer substrate, at least two of the arms of each of the floating elements being electrically doped to define piezoresistive elements on the arms, each piezoresistive element exhibiting a characteristic resistance that changes resistivity in response to lateral movements of the corresponding floating element when a voltage is applied across the tether arms by electrical contact from the back surface of the support wafer substrate through the support wafer vias to the corresponding isolated sensor body substrate regions and tether arms.

21. The sensor body and support structure of claim 18 wherein the trench in the oxide film on the front surface of the support wafer substrate comprises at least one conducting region positioned such that isolated electrical contact may be made to the conducting region, and further wherein the floating element comprises a shear stress sensor defining a capacitor between the floating element and each of the conducting regions, each capacitor changing its capacitance in response to lateral movements of the floating element when a voltage is applied across the tether arms of the floating element by electrical contact from the back surface of the support wafer substrate through the support wafer vias to the corresponding isolated substrate regions and tether arms, and contact to the conducting regions.

22. The sensor body and support structure of claim 21 wherein the conducting regions each comprise a dielectrically isolated conducting pad positioned with respect to a corresponding through-wafer via such that isolated electrical contact may be made to the conducting pad through the corresponding through-wafer via.

23. The sensor body and support structure of claim 22 wherein each conducting pad is coated with a dielectric layer.

24. The sensor body and support structure of claim 17 wherein the plate comprises a thermal flow rate sensor microbridge, first selected peripheral portions of which are released from surrounding areas of the sensor body wafer substrate and second selected portions of which are each clamped to a corresponding one of the isolated sensor body substrate regions, such that electrical contact made through one of the support wafer substrate through-wafer vias to the corresponding one of the sensor body substrate regions and microbridge clamps is isolated and thereby prevented from making contact to any other sensor body substrate region and microbridge clamp except through the microbridge, a selected area of the microbridge being electrically doped to define a suspended resistive element which exhibits a characteristic resistance, the resistance changing in response to changes in temperature of the resistive element resulting from flow of a fluid stream across the microbridge while a current source is connected across the element by electrical contact from the back surface of the support wafer substrate through the support wafer vias to corresponding isolated sensor body regions and microbridge clamps.

25. The sensor body and support structure of claim 17 wherein the plate comprises a temperature transducer microbridge, first selected peripheral portions of which are released from surrounding areas of the sensor body wafer substrate and second selected portions of which are each clamped to a corresponding one of the isolated sensor body substrate regions, such that electrical contact made through one of the support wafer substrate through-wafer vias to the corresponding one of the sensor body substrate regions and microbridge clamps is isolated and thereby prevented from making contact to any other sensor body substrate region and microbridge clamp except through the microbridge, a selected area of the microbridge being electrically doped to define a suspended resistive element which exhibits a characteristic resistance, the resistance changing in response to changes in temperature of the microbridge resulting from changes in ambient temperature while a current source is connected across the element, and the temperature of the microbridge changing in response to changes in resistance of the resistive element resulting from changes in applied level of the current source, connection of the current source made by electrical contact from the back surface of the support wafer substrate through the support wafer vias to corresponding isolated sensor body regions and microbridge clamps.

26. The sensor body and support structure of claim 24 wherein the front surface of the support wafer substrate exposed by the opening in the oxide film is grooved to extend the trench over which the sensor body microbridge is suspended to a depth below the front surface of the support wafer substrate.

27. The sensor body and support structure of claim 17 wherein the plate comprises a pressure sensor diaphragm free to move in a vertical direction perpendicular to the front surface of the sensor body wafer substrate, selected portions of peripheral edges of which are electrically doped to define piezoresistive elements, each piezoresistive element positioned with respect to a corresponding through-wafer via such that isolated electrical contact to the element may be made through the corresponding via, each piezoresistive element exhibiting a characteristic resistance that changes in response to vertical movement of the diaphragm when a voltage is applied across the piezoresistive elements by electrical contact from the back surface of the support wafer substrate through the support wafer vias to the resistive elements.

28. The sensor body and support structure of claim 17 wherein the trench in the oxide film on the front surface of the support wafer comprises at least one conducting region positioned such that isolated electrical contact may be made to the conducting region, and further wherein the plate comprises a pressure sensor diaphragm free to move in a vertical direction perpendicular to the front surface of the sensor body wafer substrate and defining a capacitor between the diaphragm and each conducting region having a characteristic capacitance, the capacitance changing in response to vertical movements of the diaphragm when a voltage is applied across the capacitor by electrical contact from the back surface of the support wafer substrate through the support wafer vias to the corresponding substrate and conducting regions.

29. The sensor body and support structure of claim 28 wherein the conducting regions each comprise a dielectrically isolated conducting pad positioned with respect to a corresponding through-wafer via such that isolated electrical contact may be made to the conducting pad through the corresponding through-wafer via.

30. The sensor body and support structure of claim 29 wherein each conducting pad is coated with a dielectric layer.

31. The sensor body and support structure of claim 18 wherein the floating element comprises a resonant element tethered by a plurality of arms, the resonant element laterally resonating in response to application of an AC voltage between the floating element and an area of the front surface of the sensor body wafer substrate not suspended over the trench in the oxide film on the front surface of the support wafer substrate by electrical contact from the back surface of the support wafer substrate through the support wafer vias to the corresponding isolated sensor body substrate regions.

32. The sensor body and support structure of claim 31 wherein the trench in the oxide film on the front surface of the support wafer substrate comprises at least one conducting region positioned such that isolated electrical contact may be made to the conducting region, the resonant element defining a capacitor between the element and each conducting region, each capacitor exhibiting a characteristic capacitance that changes in response to lateral movement of the resonant element when a voltage is applied across the capacitor by electrical contact from the back surface of the support wafer substrate through the support wafer vias to the corresponding isolated substrate region and the conducting regions, the capacitors providing means for control of the movement of the resonant element by application of a voltage which changes the capacitance of the capacitors.

33. The sensor body and support structure of claim 32 wherein the conducting regions each comprise a dielectrically isolated conducting pad positioned with respect to a corresponding through-wafer via such that isolated electrical contact may be made to the conducting pad through the corresponding through-wafer via.

34. The sensor body and support structure of claim 33 wherein each conducting pad is coated with a dielectric layer.

35. The sensor body and support structure of claim 10, fabricated by a process comprising the steps of:

forming an oxide layer on surfaces of the support wafer substrate, including the front surface and the back surface of the support wafer substrate, forming a layer of nitride on the oxide layer, photolithographically patterning and etching the oxide and nitride layers on the back surface of the support wafer to define locations of the vias on the back surface of the support wafer, anisotropically etching the support wafer until the vias extend completely through the support wafer from the back surface to the oxide layer covering the front surface of the support wafer, etching the oxide layer covering the front surface of the support wafer at locations of the vias on the front surface so that the lateral extent of each of the vias at the front surface is open, forming an oxide layer on sidewalls of the etched vias, and etching the nitride layer to remove the nitride from the oxide layer.

36. The sensor body and support structure of claim 35 fabricated by a process further comprising the process step of encapsulating the support wafer substrate in a nitride film after removing the nitride layer from the oxide layer.

37. The sensor body and support structure of claim 35 fabricated by a process further comprising the process step of high-temperature wafer bonding the front surface of the sensor body wafer substrate to the front surface of the support wafer substrate.

38. The sensor body and support structure of claim 37 fabricated by a process further comprising the process step of photolithographically patterning and etching the oxide layer on the front surface of the support wafer substrate to define an opening in the oxide layer before forming the layer of nitride on the oxide layer, the opening exposing the front surface of the support wafer substrate and resulting in a trench, defined by the opening, over which the mechanical sensor body microstructure is suspended once the sensor body wafer substrate is high-temperature wafer bonded to the support wafer substrate.

39. The sensor body and support structure of claim 38 fabricated by a process further comprising the process steps of:

etching the sensor body wafer substrate from a back surface opposite the front surface of the sensor body wafer substrate to remove a substantial thickness of the sensor body wafer substrate and leave a plate, having a thickness on a dimension of microns, suspended over the trench on the front surface of the support wafer substrate, patterning and etching the sensor body wafer substrate to produce isolating border trenches circumscribing isolated sensor body substrate regions, and patterning and etching the plate to produce a floating element having first selected peripheral portions released from surrounding areas of the sensor body wafer substrate and second selected portions each tethered by an arm to a corresponding one of the isolated sensor body substrate regions, such that electrical contact made through one of the support wafer substrate through-wafer vias to the corresponding one of the sensor body substrate regions and tether arms is isolated and thereby prevented from making contact to any other sensor body substrate region and tether arm, the floating element being free to move laterally in response to an applied force in a direction parallel to the front surface of the sensor body wafer substrate.

40. The sensor body and support structure of claim 39 fabricated by a process further comprising the process step of photolithographically patterning and etching the oxide layer on the back surface of the support wafer substrate to define an opening in the oxide layer before forming the layer of nitride on the oxide layer, the opening exposing the back surface of the support wafer substrate for contact to the substrate during process steps and sensor operation, and wherein the step of etching the sensor body wafer substrate to remove a substantial thickness of the sensor body wafer substrate comprises electrochemical etching, during which electrical contact is made to the support wafer substrate through the opening in the oxide layer on the back surface of the support wafer substrate and electrical contact is made to the sensor body wafer substrate through a support wafer substrate through-wafer via.

41. The sensor body and support structure of claim 39 fabricated by a process further comprising the process step of forming a high-temperature conducting film on the sidewalls of the through-wafer vias.

42. The sensor body and support structure of claim 39 fabricated by a process further comprising the process step of forming at least one conducting pad in the trench in the oxide layer on the front surface of the support wafer substrate.

43. The sensor body and support structure of claim 39 fabricated by a process further comprising the process step of electrically doping the isolated sensor body substrate regions.

* * * * *